(12) United States Patent
Hoey et al.

(10) Patent No.: US 11,705,354 B2
(45) Date of Patent: Jul. 18, 2023

(54) SUBSTRATE HANDLING SYSTEMS

(71) Applicant: Applied Materials, Inc., Santa Clara, CA (US)

(72) Inventors: Gee Sun Hoey, Fremont, CA (US); Balasubramaniam Coimbatore Jaganathan, Bangalore (IN); Jagan Rangarajan, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 130 days.

(21) Appl. No.: 17/098,001

(22) Filed: Nov. 13, 2020

(65) Prior Publication Data
US 2022/0013394 A1 Jan. 13, 2022

Related U.S. Application Data

(60) Provisional application No. 63/050,626, filed on Jul. 10, 2020.

(51) Int. Cl.
*H01L 21/67* (2006.01)
*H01L 21/677* (2006.01)
*B65G 47/90* (2006.01)
*H01L 21/687* (2006.01)

(52) U.S. Cl.
CPC ........ *H01L 21/67745* (2013.01); *B65G 47/90* (2013.01); *H01L 21/67742* (2013.01); *H01L 21/67748* (2013.01); *H01L 21/67751* (2013.01); *H01L 21/68707* (2013.01); *H01L 21/67028* (2013.01); *H01L 21/67219* (2013.01)

(58) Field of Classification Search
CPC .......... H01L 21/67086; H01L 21/67718; B25J 15/0253
See application file for complete search history.

(56) References Cited

U.S. PATENT DOCUMENTS

| 2,998,680 A | 9/1961 | Lipkins |
| 3,518,798 A | 7/1970 | Boettcher |
| 3,659,386 A | 5/1972 | Goetz et al. |

(Continued)

FOREIGN PATENT DOCUMENTS

| CN | 101934491 B | 7/2012 |
| CN | 103962936 A | 8/2014 |

(Continued)

OTHER PUBLICATIONS

PCT International Search Report and Written Opinion dated Aug. 3, 2021, for International Application No. PCT/US2021/026895.

*Primary Examiner* — Ronald P Jarrett
(74) *Attorney, Agent, or Firm* — Patterson +Sheridan, LLP

(57) ABSTRACT

An apparatus for transferring a substrate is disclosed herein. More specifically, the apparatus relates to substrate handling systems used in semiconductor device manufacturing, and more particularly, to substrate handling systems having a substrate handler with enclosed moving elements and increased compatibility with post-CMP cleaning modules. The apparatus includes one or more indexing assemblies. Each of the indexing assemblies including an enclosure, an actuator assembly disposed within the enclosure, and two handling blades disposed outside of the disclosure. Each of the two blades are moveable in either of a translational or a rotating manner.

16 Claims, 11 Drawing Sheets

(56) References Cited

U.S. PATENT DOCUMENTS

| | | |
|---|---|---|
| 3,665,648 A | 5/1972 | Yamanaka |
| 3,731,435 A | 5/1973 | Boettcher et al. |
| 3,762,103 A | 10/1973 | Nielsen |
| 3,913,271 A | 10/1975 | Boettcher |
| 4,020,600 A | 5/1977 | Day |
| 4,021,278 A | 5/1977 | Hood et al. |
| 4,141,180 A | 2/1979 | Gill, Jr. et al. |
| 4,502,252 A | 3/1985 | Iwabuchi |
| 4,509,298 A | 4/1985 | Klievoneit |
| 4,583,325 A | 4/1986 | Tabuchi |
| 4,653,231 A | 3/1987 | Cronkhite et al. |
| 4,944,119 A | 7/1990 | Gill, Jr. et al. |
| 5,081,051 A | 1/1992 | Mattingly et al. |
| 5,081,795 A | 1/1992 | Tanaka et al. |
| 5,216,843 A | 6/1993 | Breivogel et al. |
| 5,224,304 A | 7/1993 | Cesna |
| 5,232,875 A | 8/1993 | Tuttle et al. |
| 5,246,525 A | 9/1993 | Sato |
| 5,317,778 A | 6/1994 | Kudo et al. |
| 5,329,732 A | 7/1994 | Karlsrud et al. |
| 5,361,545 A | 11/1994 | Nakamura |
| 5,421,768 A | 6/1995 | Fujiwara et al. |
| 5,443,416 A | 8/1995 | Volodarsky et al. |
| 5,456,627 A | 10/1995 | Jackson et al. |
| 5,478,435 A | 12/1995 | Murphy et al. |
| 5,486,131 A | 1/1996 | Cesna et al. |
| 5,498,199 A | 3/1996 | Karlsrud et al. |
| 5,584,647 A | 12/1996 | Uehara et al. |
| 5,649,854 A | 7/1997 | Gill, Jr. |
| 5,692,947 A | 12/1997 | Talieh et al. |
| 5,738,574 A | 4/1998 | Tolles et al. |
| 5,804,507 A | 9/1998 | Perlov et al. |
| 5,934,979 A | 8/1999 | Talieh |
| 5,938,504 A | 8/1999 | Talieh |
| 5,944,582 A | 8/1999 | Talieh |
| 6,045,716 A | 4/2000 | Walsh et al. |
| 6,080,046 A | 6/2000 | Shendon et al. |
| 6,086,457 A | 7/2000 | Perlov et al. |
| 6,095,908 A | 8/2000 | Torii |
| 6,126,517 A | 10/2000 | Tolles et al. |
| 6,155,768 A | 12/2000 | Bacchi et al. |
| 6,156,124 A | 12/2000 | Tobin |
| 6,159,080 A | 12/2000 | Talieh |
| 6,179,690 B1 | 1/2001 | Talieh |
| 6,200,199 B1 | 3/2001 | Gurusamy et al. |
| 6,220,941 B1 | 4/2001 | Fishkin et al. |
| 6,220,942 B1 | 4/2001 | Tolles et al. |
| 6,227,948 B1 | 5/2001 | Khoury et al. |
| 6,227,950 B1 | 5/2001 | Hempel et al. |
| 6,231,428 B1 | 5/2001 | Maloney et al. |
| 6,241,592 B1 | 6/2001 | Togawa et al. |
| 6,283,822 B1 | 9/2001 | Togawa et al. |
| 6,293,849 B1 | 9/2001 | Kawashima |
| 6,309,279 B1 | 10/2001 | Bowman et al. |
| 6,322,427 B1 | 11/2001 | Li et al. |
| 6,332,826 B1 | 12/2001 | Katsuoka et al. |
| 6,343,979 B1 | 2/2002 | Peltier et al. |
| 6,350,188 B1 | 2/2002 | Bartlett et al. |
| 6,354,918 B1 | 3/2002 | Togawa et al. |
| 6,354,922 B1 | 3/2002 | Sakurai et al. |
| 6,354,926 B1 | 3/2002 | Walsh |
| 6,358,126 B1 | 3/2002 | Jackson et al. |
| 6,361,648 B1 | 3/2002 | Tobin |
| 6,398,625 B1 | 6/2002 | Talieh |
| 6,402,598 B1 | 6/2002 | Ahn et al. |
| 6,409,582 B1 | 6/2002 | Togawa et al. |
| 6,413,146 B1 | 7/2002 | Katsuoka et al. |
| 6,413,356 B1 | 7/2002 | Chokshi et al. |
| 6,413,873 B1 | 7/2002 | Li et al. |
| 6,435,941 B1 | 8/2002 | White |
| 6,447,385 B1 | 9/2002 | Togawa et al. |
| 6,475,914 B2 | 11/2002 | Han |
| 6,572,730 B1 | 6/2003 | Shah |
| 6,575,816 B2 | 6/2003 | Hempel et al. |
| 6,579,148 B2 | 6/2003 | Hirokawa et al. |
| 6,582,282 B2 | 6/2003 | Somekh |
| 6,586,336 B2 | 7/2003 | Jeong |
| 6,592,438 B2 | 7/2003 | Tolles et al. |
| 6,592,439 B1 | 7/2003 | Li et al. |
| 6,629,883 B2 | 10/2003 | Katsuoka et al. |
| 6,682,408 B2 | 1/2004 | Sakurai et al. |
| 6,716,086 B1 | 4/2004 | Tobin |
| 6,780,773 B2 | 8/2004 | Li et al. |
| 6,793,565 B1 | 9/2004 | Chadda et al. |
| 6,805,616 B2 | 10/2004 | Kawashima |
| 6,817,923 B2 | 11/2004 | Smith |
| 6,841,057 B2 | 1/2005 | Wadensweiler et al. |
| 6,848,976 B2 | 2/2005 | Somekh |
| 6,852,017 B2 | 2/2005 | Brown |
| 6,857,941 B2 | 2/2005 | Emami et al. |
| 6,869,345 B2 | 3/2005 | Brown |
| 6,872,129 B2 | 3/2005 | Tobin |
| 6,878,044 B2 | 4/2005 | Sakurai et al. |
| 6,916,231 B2 | 7/2005 | Wakabayashi |
| 6,918,814 B2 | 7/2005 | Katsuoka et al. |
| 6,935,934 B2 | 8/2005 | Walsh |
| 6,942,541 B2 | 9/2005 | Togawa et al. |
| 6,942,545 B2 | 9/2005 | Jeong |
| 6,949,466 B2 | 9/2005 | Jeong |
| 6,951,507 B2 | 10/2005 | Talieh |
| 6,969,305 B2 | 11/2005 | Kimura et al. |
| 6,977,036 B2 | 12/2005 | Wadensweiler et al. |
| 7,004,815 B2 | 2/2006 | Jeong |
| 7,011,569 B2 | 3/2006 | Shimizu et al. |
| 7,044,832 B2 | 5/2006 | Yilmaz et al. |
| 7,063,603 B2 | 6/2006 | Moore et al. |
| 7,066,791 B2 | 6/2006 | Brown |
| 7,070,475 B2 | 7/2006 | Manens et al. |
| 7,074,109 B1 | 7/2006 | Bennett et al. |
| 7,077,721 B2 | 7/2006 | Hu et al. |
| 7,084,064 B2 | 8/2006 | Liu et al. |
| 7,097,544 B1 | 8/2006 | Tolles et al. |
| 7,101,253 B2 | 9/2006 | Olgado |
| 7,101,255 B2 | 9/2006 | Katsuoka et al. |
| 7,104,867 B2 | 9/2006 | Jeong |
| 7,104,875 B2 | 9/2006 | Birang et al. |
| 7,166,016 B1 | 1/2007 | Chen |
| 7,198,551 B2 | 4/2007 | Talieh |
| 7,238,090 B2 | 7/2007 | Tolles et al. |
| 7,241,203 B1 | 7/2007 | Chen et al. |
| 7,255,632 B2 | 8/2007 | Tolles et al. |
| 7,273,408 B2 | 9/2007 | Chen et al. |
| 7,303,467 B2 | 12/2007 | Birang et al. |
| 7,390,744 B2 | 6/2008 | Jia et al. |
| 7,614,939 B2 | 11/2009 | Tolles et al. |
| 7,651,384 B2 | 1/2010 | Golden et al. |
| 8,079,894 B2 | 12/2011 | Tolles et al. |
| 8,137,162 B2 | 3/2012 | Abrahamians et al. |
| 8,172,643 B2 | 5/2012 | Yilmaz et al. |
| 8,202,140 B2 | 6/2012 | Hong et al. |
| 8,308,529 B2 | 11/2012 | D'Ambra et al. |
| 8,967,935 B2 | 3/2015 | Goodman et al. |
| 8,968,055 B2 | 3/2015 | Chen et al. |
| 9,017,138 B2 | 4/2015 | Chen et al. |
| 9,227,293 B2 | 1/2016 | David et al. |
| 9,352,441 B2 | 5/2016 | Zuniga et al. |
| 9,421,617 B2 | 8/2016 | Goodman et al. |
| 9,434,045 B2 | 9/2016 | Yeh et al. |
| 9,570,311 B2 | 2/2017 | Kuo et al. |
| 9,592,585 B2 | 3/2017 | Lin et al. |
| 9,610,673 B2 | 4/2017 | Torikoshi |
| 9,687,955 B2 | 6/2017 | Watanabe et al. |
| 10,040,166 B2 | 8/2018 | Nabeya et al. |
| 10,293,455 B2 | 5/2019 | Nabeya et al. |
| 10,478,938 B2 | 11/2019 | Torikoshi |
| 10,486,285 B2 | 11/2019 | Miyazaki et al. |
| 10,513,006 B2 | 12/2019 | Wu et al. |
| 10,906,756 B2 * | 2/2021 | Wakabayashi .... H01L 21/67178 |
| 2002/0009954 A1 | 1/2002 | Togawa et al. |
| 2002/0115392 A1 | 8/2002 | Kawashima |
| 2002/0197946 A1 | 12/2002 | Emami et al. |
| 2003/0003848 A1 | 1/2003 | Tobin |
| 2003/0017706 A1 | 1/2003 | Moore et al. |
| 2003/0022497 A1 | 1/2003 | Li et al. |

(56) References Cited

U.S. PATENT DOCUMENTS

| | | |
|---|---|---|
| 2003/0026683 A1 | 2/2003 | Govzman et al. |
| 2003/0202092 A1 | 10/2003 | Sadighi et al. |
| 2004/0023495 A1 | 2/2004 | Butterfield et al. |
| 2004/0053560 A1 | 3/2004 | Sun et al. |
| 2004/0053566 A1 | 3/2004 | Tolles et al. |
| 2004/0072445 A1 | 4/2004 | Sun et al. |
| 2004/0072499 A1 | 4/2004 | Wakabayashi |
| 2004/0097169 A1 | 5/2004 | Moore |
| 2004/0137823 A1 | 7/2004 | Sakurai et al. |
| 2005/0070210 A1 | 3/2005 | Jeong |
| 2005/0176349 A1 | 8/2005 | Yilmaz et al. |
| 2005/0178666 A1 | 8/2005 | Tsai et al. |
| 2005/0227586 A1 | 10/2005 | Jeong |
| 2005/0233578 A1 | 10/2005 | Jia et al. |
| 2005/0272352 A1 | 12/2005 | Polyak et al. |
| 2005/0282472 A1 | 12/2005 | Jeong |
| 2006/0003673 A1 | 1/2006 | Moore |
| 2006/0030156 A1 | 2/2006 | Butterfield et al. |
| 2006/0035563 A1 | 2/2006 | Kalenian et al. |
| 2006/0046623 A1 | 3/2006 | Wang et al. |
| 2006/0057812 A1 | 3/2006 | Liu et al. |
| 2006/0070872 A1 | 4/2006 | Mavliev et al. |
| 2006/0105680 A1 | 5/2006 | Jeong |
| 2006/0172671 A1 | 8/2006 | Chen et al. |
| 2006/0183407 A1 | 8/2006 | David |
| 2007/0066200 A9 | 3/2007 | Li et al. |
| 2007/0077861 A1 | 4/2007 | Chen |
| 2007/0096315 A1 | 5/2007 | Manens et al. |
| 2007/0128982 A1 | 6/2007 | Lee et al. |
| 2008/0026681 A1 | 1/2008 | Butterfield et al. |
| 2008/0035474 A1 | 2/2008 | Wang et al. |
| 2008/0038993 A1 | 2/2008 | Jeong |
| 2008/0047841 A1 | 2/2008 | Manens et al. |
| 2008/0051014 A1 | 2/2008 | Jeong et al. |
| 2008/0156657 A1 | 7/2008 | Butterfield et al. |
| 2008/0166958 A1 | 7/2008 | Golden et al. |
| 2008/0242202 A1 | 10/2008 | Wang et al. |
| 2008/0274673 A1 | 11/2008 | Adachi |
| 2009/0068934 A1 | 3/2009 | Hong et al. |
| 2009/0196724 A1 | 8/2009 | Chen et al. |
| 2009/0270015 A1 | 10/2009 | D'Ambra et al. |
| 2009/0305612 A1 | 12/2009 | Miyazaki et al. |
| 2012/0064800 A1 | 3/2012 | Watanabe et al. |
| 2012/0322345 A1 | 12/2012 | Rangarajan et al. |
| 2013/0115862 A1 | 5/2013 | Rangarajan et al. |
| 2013/0199405 A1 | 8/2013 | Rangarajan et al. |
| 2013/0288578 A1 | 10/2013 | Chen et al. |
| 2014/0003890 A1 | 1/2014 | Goto |
| 2014/0030048 A1* | 1/2014 | Kosuge ............ H01L 21/68728 414/225.01 |
| 2014/0213157 A1 | 7/2014 | Torikoshi |
| 2014/0220863 A1 | 8/2014 | Wu et al. |
| 2015/0044944 A1 | 2/2015 | Chen |
| 2015/0098773 A1 | 4/2015 | Rice et al. |
| 2015/0318179 A1 | 11/2015 | Yeh et al. |
| 2015/0367464 A1 | 12/2015 | Chen |
| 2016/0096211 A1 | 4/2016 | Izaki |
| 2018/0311784 A1 | 11/2018 | Trojan |

FOREIGN PATENT DOCUMENTS

| | | |
|---|---|---|
| CN | 104303272 A | 1/2015 |
| CN | 102725830 B | 3/2016 |
| CN | 104303272 B | 6/2017 |
| CN | 103962936 B | 8/2018 |
| CN | 105904335 B | 4/2019 |
| DE | 3411120 A1 | 11/1984 |
| DE | 3737904 A1 | 5/1989 |
| EP | 1738871 B1 | 2/2009 |
| WO | 02089183 A2 | 11/2002 |
| WO | 2019089467 A1 | 5/2019 |

* cited by examiner

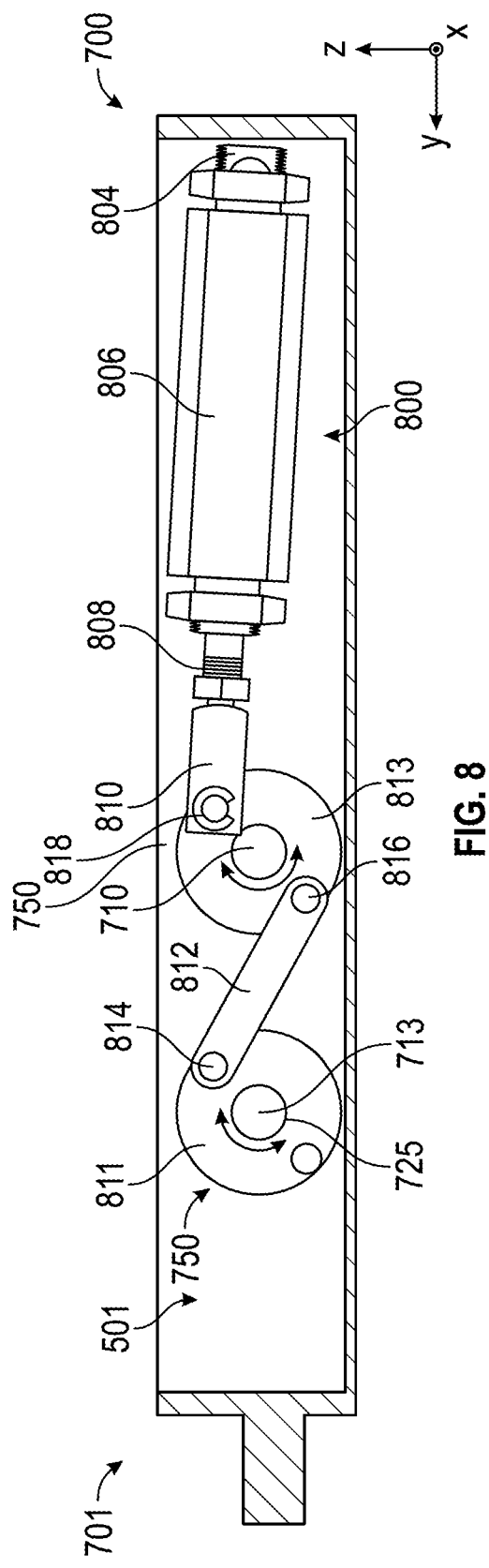
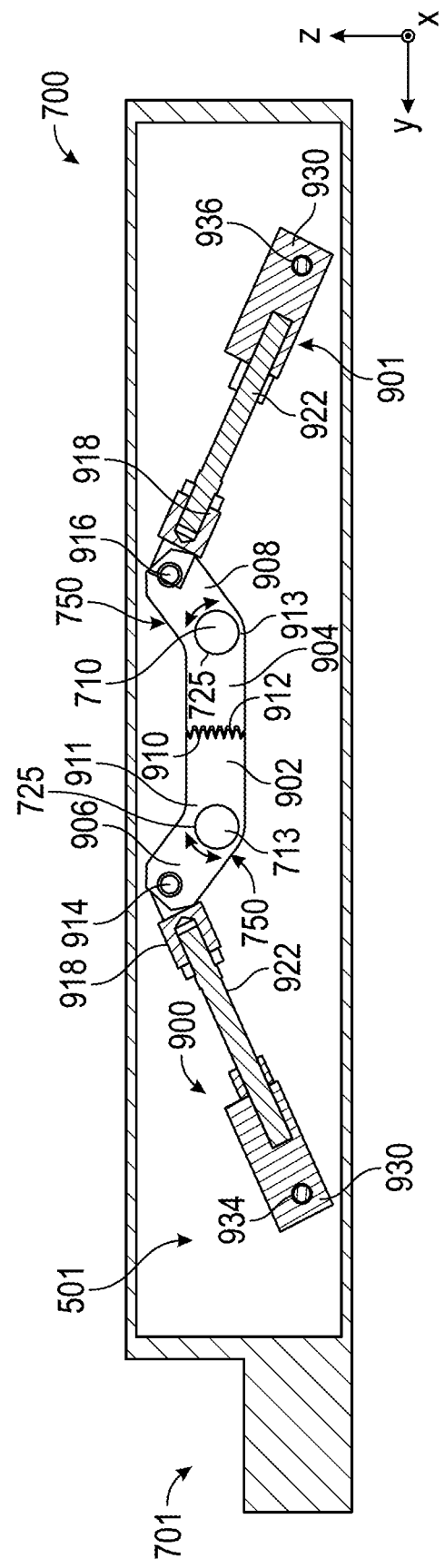
FIG. 8
FIG. 9

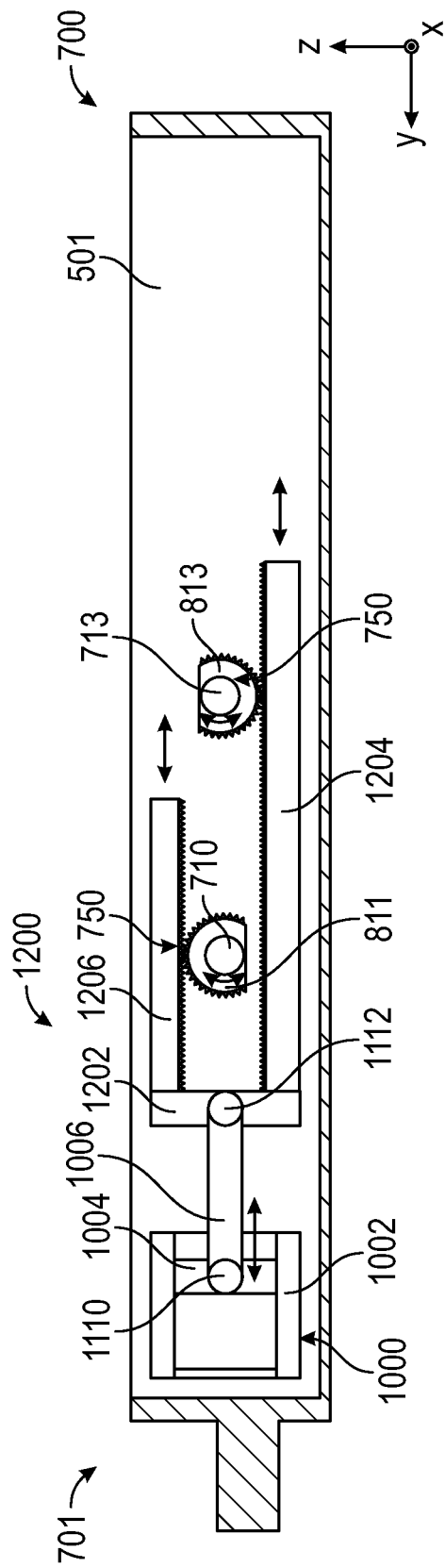

SUBSTRATE HANDLING SYSTEMS

CROSS-REFERENCE TO RELATED APPLICATIONS

This application claims priority to U.S. Provisional Patent Application No. 63/050,626, filed Jul. 10, 2020, the entirety of which is herein incorporated by reference.

BACKGROUND

Field

Embodiments of the present disclosure generally relate to methods and apparatuses used in semiconductor device manufacturing. In particular, embodiments herein relate to substrate handling systems for use with a modular polishing system.

Description of the Related Art

Chemical mechanical polishing (CMP) is commonly used in the manufacturing of high-density integrated circuits to planarize or polish a layer of material deposited on a substrate. A CMP processing system typically includes a first portion, e.g., a substrate polishing portion featuring one or more polishing stations, and a second portion featuring one or a combination of post-CMP cleaning, inspection, and/or pre or post-CMP metrology stations. The second portion is often integrated with the first portion to form a single polishing system. Often, the second portion includes one or more substrate handlers used to transfer substrates between the first and second portions and between individual systems or stations within the second portion.

Typically, during a polishing process, substrates are disposed in a horizontal orientation, as an active surface thereof, e.g., a device side surface, is urged against a polishing pad in the presence of a polishing fluid. Substrates are first polished in the horizontal orientation, and are then moved to a vertical orientation to be cleaned in a cleaner. Next, the substrates are rotated back to the horizontal orientation and flipped to device side up for further processing. As a result, a substrate indexing assembly in such a system may need to be able to carry substrates in both vertical and horizontal positions, and to move and/or flip the substrates therebetween. Further, the substrate indexing assembly needs to be designed to reduce contaminant particle deposition on the substrate caused by the substrate indexing assembly.

As footprint density requirements increase, the clearance space in which substrate indexing assemblies operate decreases. Additionally, moving parts within the substrate indexing assemblies which are exposed to the processing environment have been found to cause contamination of substrates as substrates are transferred between process modules.

Accordingly, there is a need in the art for substrate processing systems that solve the problems described above.

SUMMARY

The present disclosure generally relates to a substrate handling system. The substrate handling system includes an enclosure comprising an outer wall having a first opening and a second opening formed there through, an actuator assembly disposed within the enclosure, a first handling blade coupled to the actuator assembly through the first opening, and a second handling blade coupled to the actuator assembly through the second opening. The first handling blade includes a first substrate handling surface disposed outside of the enclosure and the second handling blade includes a second substrate handling surface disposed outside of the enclosure.

Another embodiment of the present disclosure further includes, a substrate handling system including a guiding beam, a support column coupled to the guiding beam and moveable along a first axis, a first rail disposed along a length of the support column and perpendicular to the first axis, a second rail disposed along the length of the support column and parallel to the first rail, a first substrate indexer assembly moveably coupled to the first rail, and a second substrate indexer assembly moveably coupled to the second rail. The first substrate indexer assembly and the second substrate indexer assembly each include an enclosure, the enclosure comprising an outer wall with a first opening and a second opening formed therethrough. An actuator assembly is disposed within the enclosure. A first handling blade is coupled to the actuator assembly, the first handling blade including a first substrate handling surface disposed outside of the enclosure. A second handling blade is coupled to the actuator assembly, the second handling blade including a second substrate handling surface disposed outside of the enclosure.

Yet another embodiment of the present disclosure includes a substrate handling system. The substrate handling system includes a guiding beam, a support column coupled to the guiding beam and moveable along a first axis, a first rail disposed along a length of the support column and perpendicular to the first axis, a second rail disposed along the length of the support column and parallel to the first rail, a first substrate indexer assembly moveably coupled to the first rail, a second substrate indexer assembly moveably coupled to the second rail, and a controller. The controller is configured to secure a substrate within a horizontal pre-clean module with the first substrate indexer assembly in a horizontal position, remove the substrate from the horizontal pre-clean module with the first substrate indexer assembly, swing the substrate to a vertical position after securing the substrate by pivoting the first substrate indexer assembly, lower the substrate into a vertical cleaning module, and release the substrate after lowering the substrate into the vertical cleaning module. After releasing the substrate the controller secures the substrate with the second substrate indexer assembly from the vertical cleaning module, raises the substrate to a transfer position after securing the substrate with the second substrate indexer assembly, and move the support column in a horizontal direction along the guiding.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, which may admit to other equally effective embodiments.

FIG. 8 is a schematic cross sectional side view of a portion of a substrate indexer assembly, according to another embodiment, which may be used in place of the substrate indexer assembly of FIGS. 7A-7B.

FIG. 9 is a second schematic cross sectional side view of a portion of a substrate indexer assembly, according to another embodiment which may be used in place of the substrate indexer assembly of FIG. 7A-7B.

FIG. 12 is a schematic cross sectional side view of a portion of a substrate indexer assembly, according to another embodiment, which may be used with the substrate indexer assembly of FIG. 7A-7B.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments provided in this application are related to substrate handling systems used in semiconductor device manufacturing, and more particularly, to substrate handling systems having a substrate handler with enclosed moving elements and increased compatibility with post-chemical mechanical polishing (CMP) cleaning modules.

In embodiments described herein, substrate handling and movement in a substrate handling system includes one or more indexing systems. Each indexing system includes two gripping blades configured to grip a substrate at contact points around a circumferential edge thereof. The gripping blades are designed to minimize the contact area between the blades and the substrate edge using contact fingers. At least a portion of the gripping blades are coupled to and/or disposed within a housing module. Here, the indexing system further includes an actuator for moving one or both of the gripping blades to capture the substrate for transfer between processing stations and release the substrate after positioning the substrate therein or thereon. In embodiments therein, the actuator and at least a portion of the moving elements which enable the movement of the gripping blades are disposed and/or enclosed within the housing module. Enclosing the actuator and the moving elements beneficially prevents particulate matter produced therefrom from entering the processing environment and potentially contaminating substrates and/or other surfaces disposed therein.

The handling systems provided herein typically include a plurality of substrate gripping systems for concurrent handling of a corresponding plurality of substrates. The handling system includes a vertical runner with vertical rails. The vertical rails are parallel rails along the length of the vertical runner, and a gripping system is disposed on each rail of the vertical rails. The vertical rails move the gripping systems, such that each of a first gripping system on one of the rails is moved independently from a second gripping system on a second of the rails. The gripping systems are used to transfer substrates to and from processing chambers, e.g., cleaning and drying modules, disposed proximate the handling system.

Figure 1:
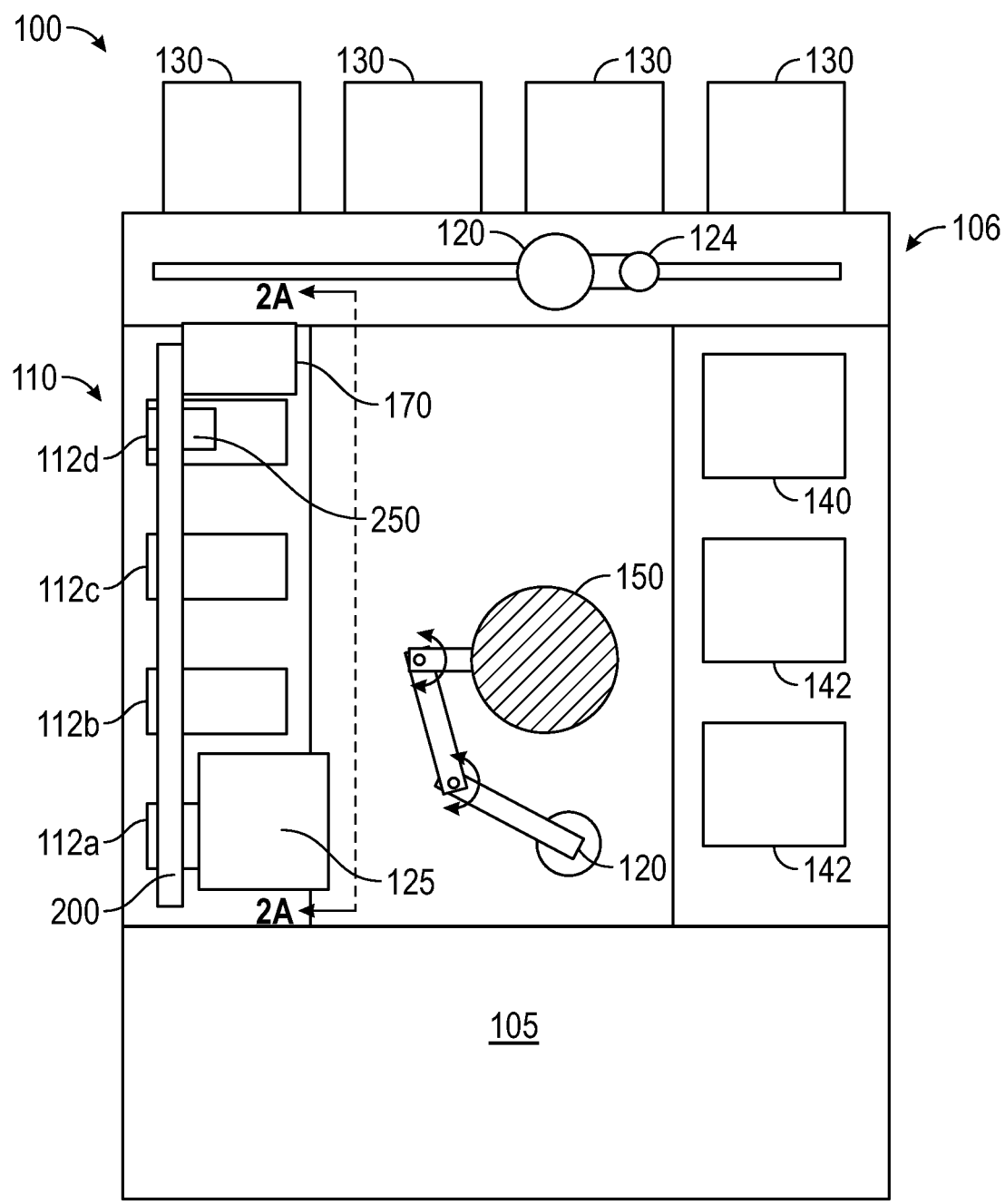
FIG. 1 is a schematic plan view of an exemplary chemical mechanical polishing (CMP) processing system which uses a substrate handling system described herein, according to one embodiment.
Figure 1:
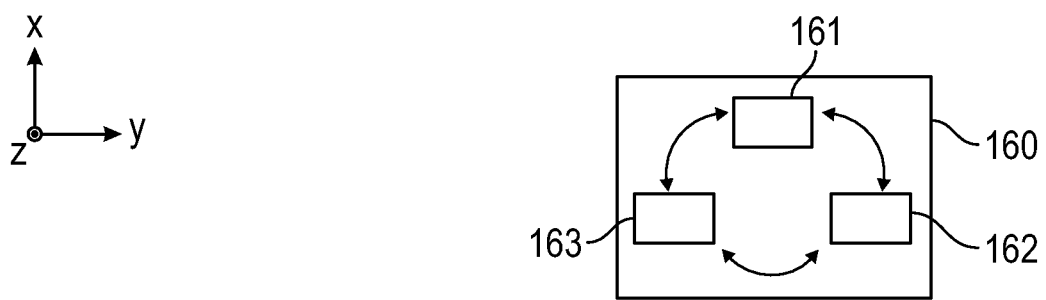

FIG. 1 is a schematic plan view of an exemplary CMP processing system 100, which uses the substrate handling system described herein, according to one embodiment. Here, the processing system 100 includes a first portion 105 and a second portion 106 coupled to the first portion 105 and integrated therewith. The first portion 105 is a substrate polishing portion featuring a plurality of polishing stations (not shown).

The second portion 106 includes one or more post-CMP cleaning systems 110, a plurality of system loading stations 130, one or more substrate handlers, e.g., a first robot 124 and a second robot 150, one or more metrology stations 140, one or more location specific polishing (LSP) modules 142, one or more horizontal pre-clean (HPC) modules 125, one or more drying units 170, and one or more vertical cleaning modules 112a-d. The HPC module 125 is configured to process a substrate 120 disposed in a substantially horizontal orientation (i.e., x-y plane) and the vertical cleaning modules 112a-d are configured to process substrates 120 disposed in substantially vertical orientations (i.e., z-y plane).

Each LSP module 142 is typically configured to polish only a portion of a substrate surface using a polishing member (not shown) that has a surface area that is less than the surface area of a to-be polished substrate 120. LSP modules 142 are often used after the substrate 120 has been polished with a polishing module to touch up, e.g., remove additional material, from a relatively small portion of the substrate.

The metrology station 140 is used to measure the thickness of a material layer disposed on the substrate 120 before and/or after polishing, to inspect the substrate 120 after polishing to determine if a material layer has been cleared from the field surface thereof, and/or to inspect the substrate surface for defects before and/or after polishing. In those embodiments, the substrate 120 may be returned to the polishing pad for further polishing and/or directed to a different substrate processing module or station, such as a polishing module within the first portion 105 or to an LSP module 142 based on the measurement or surface inspection results obtained using the metrology station 140.

The first robot 124 is positioned to transfer substrates 120 to and from the plurality of system loading stations 130, e.g., between the plurality of system loading stations 130 and the second robot 150 and/or between the cleaning system 110 and the plurality of system loading stations 130. In some embodiments, the first robot 124 is positioned to transfer the substrate 120 between any of the system loading stations 130 and a processing system positioned proximate thereto. For example, in FIG. 1 the first robot 124 is positioned to transfer the substrate 120 between one of the system loading stations 130 and the metrology station 140.

The second robot 150 is used to transfer the substrate 120 between the first portion 105 and the second portion 106. For example, here the second robot 150 is positioned to transfer a to-be-polished substrate 120 received from the first robot 124 to the first portion 105 for polishing therein. The second robot 150 is then used to transfer the polished substrate 120 from the first portion 105, e.g., from a transfer station (not shown) within the first portion 105, to the horizontal pre-clean module 125. Alternatively, the second robot 150 transfers the substrate 120 from the transfer station within the first portion 105 to one of the LSP modules 142 or the metrology station 140. The second robot 150 may also transfer the substrate 120 from either of the LSP modules 142 or the metrology station 140 to the first portion 105 for further polishing therein.

The CMP processing system 100 is shown as having a single cleaning station 110. In some embodiments, the processing system 100 features at least two cleaning stations 110 disposed on either side of the second robot 150. Here, the cleaning station 110 includes the horizontal pre-clean module 125, the plurality of cleaning modules 112a-d, one or more drying units 170, and a substrate handling system 200 for transferring substrates 120 therebetween. The horizontal pre-clean module 125 is disposed within the second portion 106 in a location proximate to the first portion 105.

Typically, the horizontal pre-clean module 125 receives a polished substrate 120 from the second robot 150 through a first opening (not shown) formed in a side panel of the horizontal pre-clean module 125, e.g., though a door or a slit valve disposed in the side panel. The substrate 120 is received in a horizontal orientation by the horizontal pre-clean module 125 for positioning on a horizontally disposed substrate support surface therein. The horizontal pre-clean module 125 then performs a pre-clean process, such as a buffing process, on the substrate 120 before the substrate 120 is transferred therefrom using a first substrate indexer assembly 275a (shown and described in FIG. 2) of the substrate handling system 200 (further described in FIG. 2). The substrate 120 is transferred from the pre-clean module 125 through a second opening, here the opening 230 (FIG. 2), which is typically a horizontal slot disposed though a second side panel of the horizontal pre-clean HPC module 125 closeable with a door, e.g., a slit valve. Thus, the substrate 120 is still in a horizontal orientation as it is transferred from the pre-clean module 125. After the substrate 120 is transferred from the pre-clean module 125, the substrate handling system 200 swings the substrate 120 to a vertical position for further processing in the vertical cleaning modules 112a-d of the cleaning station 110.

The plurality of vertical cleaning modules 112a-d are located within the second portion 106. The one or more vertical cleaning modules 112a-d are any one or combination of contact and non-contact cleaning systems for removing polishing byproducts from the surfaces of a substrate, e.g., spray boxes and/or brush boxes.

The drying unit 170 is used to dry the substrate 120 after the substrate has been processed by the cleaning modules 112a-d and before the substrate 120 is transferred to a system loading station 130 by the first robot 124. Here, the drying unit 170 is a horizontal drying unit, such that the drying unit 170 is configured to receive a substrate 120 through an opening 235 (FIG. 2) while the substrate 120 is disposed in a horizontal orientation.

Herein, substrates 120 are moved between the horizontal pre-clean HPC module 125 and the vertical cleaning modules 112a-d between individual ones of the cleaning modules 112a-d, and between the cleaning modules 112a-d and the drying unit 170 using the substrate handling system 200.

In embodiments herein, operation of the CMP processing system 100, including the substrate handling system 200, is directed by a system controller 160. The system controller 160 includes a programmable central processing unit (CPU) 161 which is operable with a memory 162 (e.g., non-volatile memory) and support circuits 163. The support circuits 163 are conventionally coupled to the CPU 161 and comprise cache, clock circuits, input/output subsystems, power supplies, and the like, and combinations thereof coupled to the various components of the CMP processing system 100, to facilitate control thereof. The CPU 161 is one of any form of general purpose computer processor used in an industrial setting, such as a programmable logic controller (PLC), for controlling various components and sub-processors of the processing system. The memory 162, coupled to the CPU 161, is non-transitory and is typically one or more of readily available memories such as random access memory (RAM), read only memory (ROM), floppy disk drive, hard disk, or any other form of digital storage, local or remote.

Typically, the memory 162 is in the form of a non-transitory computer-readable storage media containing instructions (e.g., non-volatile memory), which when executed by the CPU 161, facilitates the operation of the CMP processing system 100. The instructions in the memory 162 are in the form of a program product such as a program that implements the methods of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein).

Illustrative non-transitory computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory devices, e.g., solid state drives (SSD) on which information may be permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure. In some embodiments, the methods set forth herein, or portions thereof, are performed by one or more application specific integrated circuits (ASICs), field-programmable gate arrays (FPGAs), or other types of hardware implementations. In some other embodiments, the substrate processing and/or handling methods set forth herein are performed by a combination of software routines, ASIC(s), FPGAs and, or, other types of hardware implementations. One or more system controllers 160 may be used with one or any combination of the various modular polishing systems described herein and/or with the individual polishing modules thereof.

Figure 2:
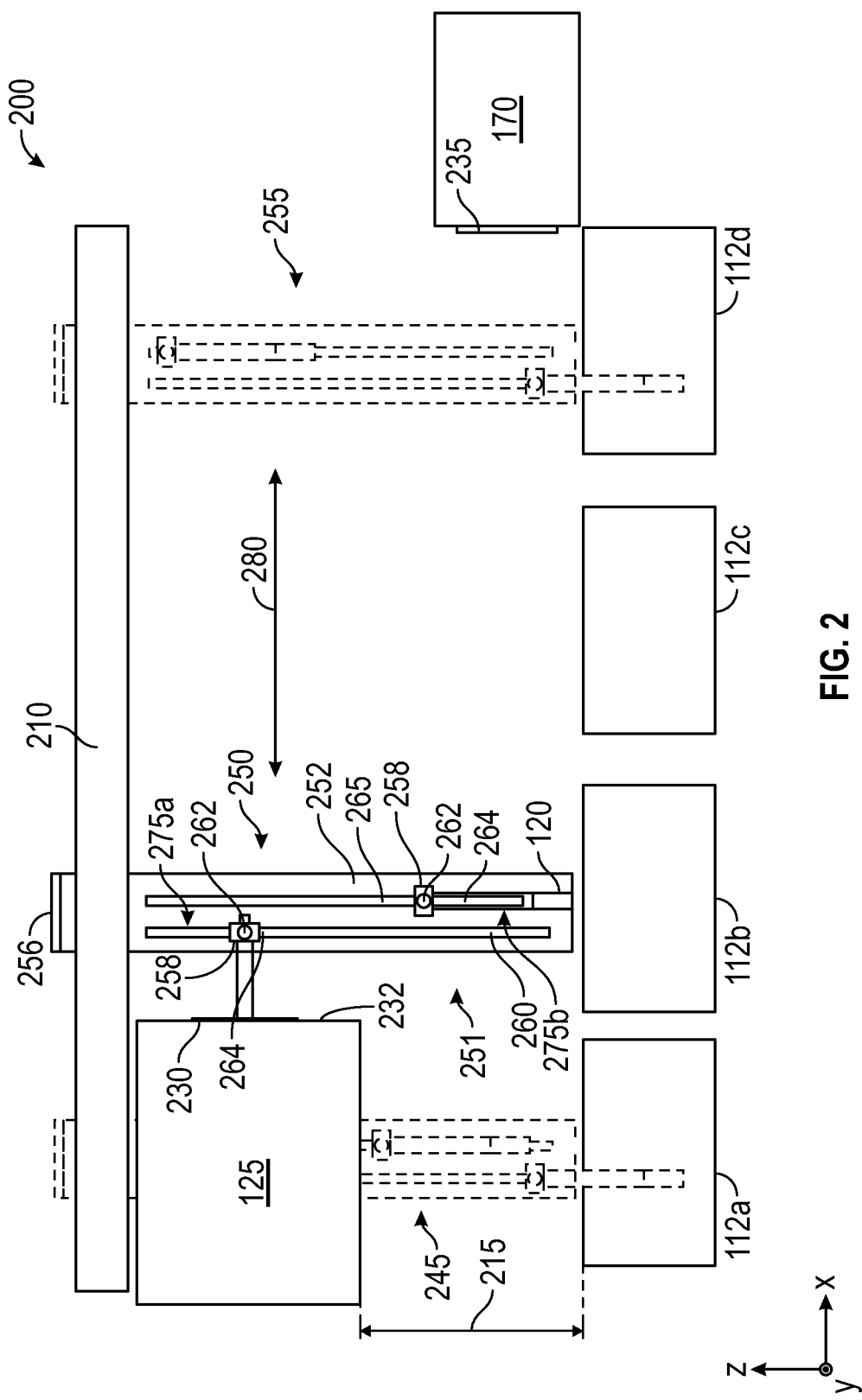
FIG. 2 is a schematic side view of a substrate handling system illustrating substrate handling methods set forth herein, according to one embodiment.

FIG. 2 is a schematic side view of the substrate handling system 200 illustrating the substrate handling methods set forth herein, according to one embodiment. The substrate handling system 200 includes a guiding beam 210 and a substrate transfer assembly 250 movably coupled to the guiding beam 210. The substrate transfer assembly 250 includes a plurality of indexer assemblies, such as the first indexer assembly 275a and a second indexer assembly 275b. The substrate transfer assembly 250 is movable along the guiding beam 210 to facilitate substrate transfer between the pre-clean module 125, the vertical cleaning modules 112a-d, and the drying unit 170.

Here, the substrate transfer assembly 250 is used to align the first indexer assembly 275a or the second indexer assembly 275b with one of the vertical cleaning modules 112a-d disposed there beneath so that a substrate may be transferred to and/or from the respective cleaning module 112a-d. The substrate is transferred to and/or from the respective vertical cleaning modules 112a-d through vertical movement of the first indexer assembly 275a and the second indexer assembly 275b. Here, the cleaning modules 112a-d (four shown) comprise a plurality of cleaning modules 112a-d, such as two or more, three or more, or four more.

The horizontal pre-clean (HPC) module 125, the cleaning modules 112a-d, and the drying unit 170 are disposed in an arrangement to desirably reduce the overall cleanroom footprint of the processing system 100. For example, here the HPC module 125 is disposed in an upper region of the second portion 106 so that at least a portion of the HPC module 125 is disposed above a first vertical cleaning module 112a. The HPC module 125 is spaced apart from the cleaning module 112a by a distance 215 to allow for substrates disposed in a vertical orientation to be moved therebetween. Thus, the distance 215 is greater than the diameter of a substrate, e.g., greater than 300 mm for a processing system 100 configured to process 300 mm diameter substrates, although appropriate scaling may be used for processing systems configured to process substrates of different diameters. Beneficially, the low profile substrate indexer assemblies 275a-b provided herein allow for reduced vertical spacing between the HPC module 125 and the vertical cleaning modules 112a-d disposed there beneath. For example, in some embodiments the distance 215 is about 2 times (2×) the diameter of a substrate or less, such as about 1.9× or less, about 1.8× or less, about 1.7× or less, 1.6× or less, or about 1.5× or less. The drying unit 170 is disposed proximate to the vertical post-CMP cleaning module 112d and is positioned to facilitate access there into by both the substrate handling system 200 and the first robot 124.

In FIG. 2, the substrate transfer assembly 250 is shown in a first position 251. In the first position 251, the first substrate indexer assembly 275a is disposed proximate to the opening 230 of the horizontal pre-clean module 125. As shown, the first substrate indexer assembly 275a is disposed in a horizontal position in order to retrieve a substrate, such as the substrate 120, from a horizontally disposed substrate support (not shown) in the HPC module. Once the substrate 120 has been removed from the HPC module 125 through the opening 230, the first substrate indexer assembly 275a is swiveled to a vertical position (similar to the second substrate indexer assembly 275b). Swiveling the first substrate indexer assembly 275a to a vertical position moves the substrate 120 to a substantially vertical orientation for transfer into any one of the vertical clean modules 112a-d.

Typically, the substrate transfer assembly 250 is then moved along the guiding beam 210 in a horizontal direction 280 to a second position 245. In the second position 245, the substrate transfer assembly 250 (shown in phantom) is disposed proximate the HPC module 125, such that the first substrate indexer assembly 275a and the second substrate indexer assembly 275b are disposed between the HPC module 125 and the vertical cleaning module 112a. In the second position 245, the first substrate indexer assembly 275a and the second substrate indexer assembly 275b are moved to a lower position along the substrate transfer assembly 250 to avoid undesirable contact with the horizontal pre-clean module 125. Beneficially, the low profile indexer assemblies 275a-b provided herein facilitate the above described arrangement of the HPC module 125 within the cleaning system 110 to enable improved throughput footprint density realized therefrom. Herein, movement of the indexer assemblies 275a-b are coordinated to transfer substrates to and from the vertical clean modules 112a-d at positions between and including the second position 245 and a third position 255 (showing the substrate transfer assembly 250 in phantom). Here, the substrate transfer assembly 250 is moved along the guiding beam 210 from the second position 245 to the third position 255 and to positions therebetween. In the third position 255, the substrate transfer assembly 250 is disposed above the vertical cleaning module 112d. In the third position 255, the vertical movement paths of the indexer assemblies 275a-b are unobstructed by the HPC module 125. Typically, after substrates have been processed in one or more of the vertical clean modules 112a-d, the second substrate indexer assembly 275b is swiveled to a horizontal position (not shown) to facilitate transfer of a now horizontally oriented substrate into the opening 235 of the drying unit 270. The indexer assemblies 275a-b, and alternate embodiments thereof, are described in greater detail below.

Figure 3B:
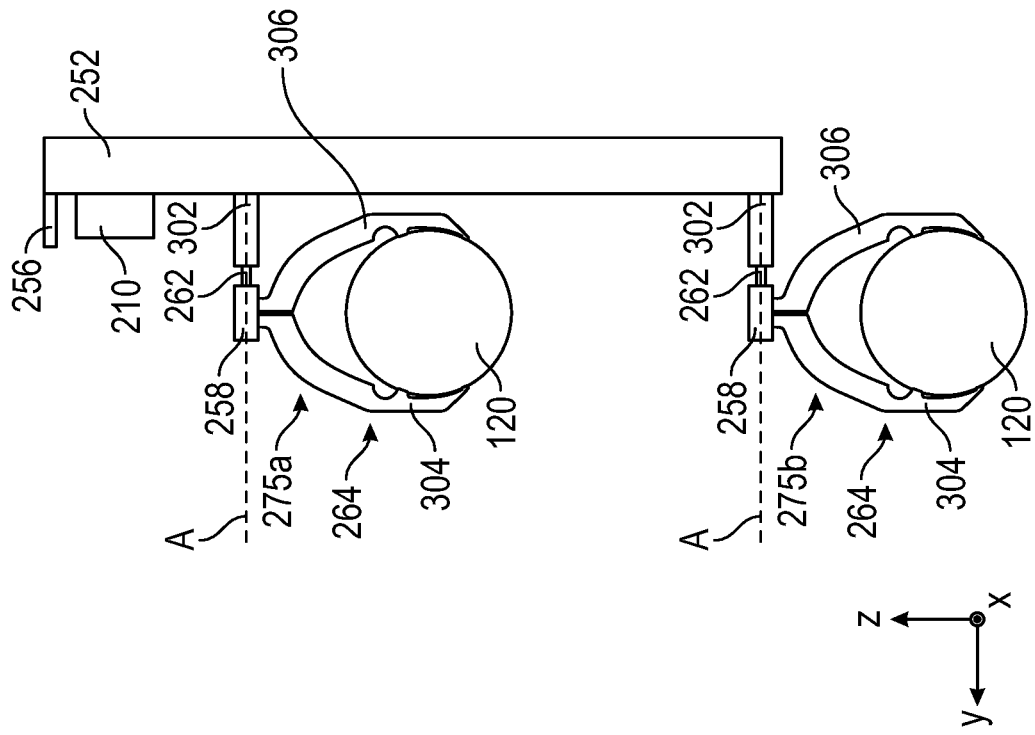
FIGS. 3A-3B are schematic side views of a substrate transfer assembly of the substrate handling system of FIG. 2, according to embodiments described herein.
Figure 3A:
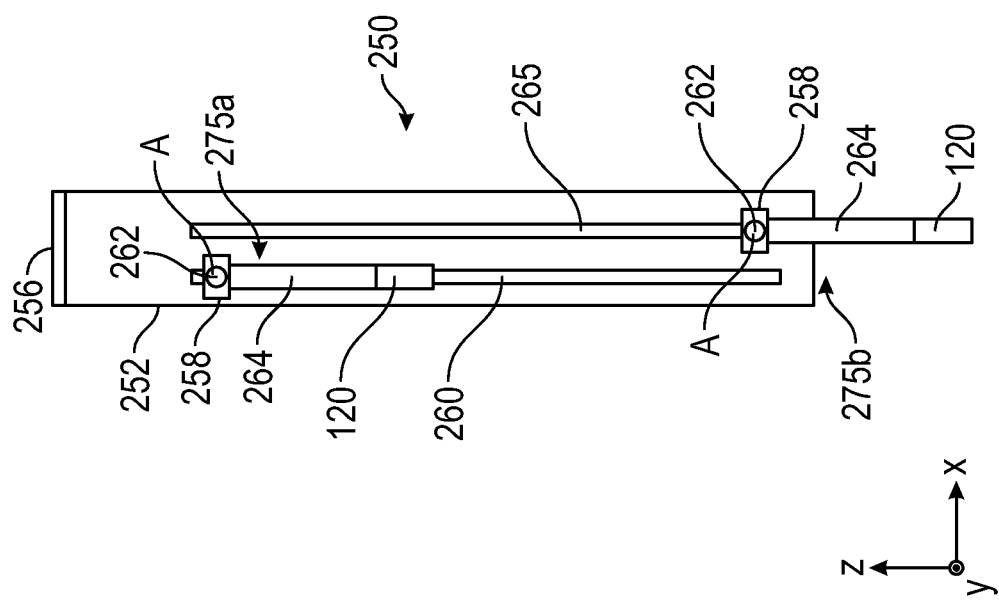

FIGS. 3A-3B are schematic side views of the substrate transfer assembly 250 of the substrate handling system 200 of FIG. 2, according to one embodiment. The side view in FIG. 3B is orthogonal to the side view of FIG. 3A.

Here, the substrate transfer assembly 250 includes a support column 252, an actuator (not shown) for moving the support column 252 along the guide beam 210, and linear members, such as the first rail 260 and the second rail 265, coupled to the support column 252. The substrate transfer assembly 250 further includes the indexer assemblies 275a-b which are movably coupled to first and second rails 260, 265 using corresponding connection members, such as connection shafts 262.

Here, the support column 252 is movably coupled to the guide beam using an overhang member 256 disposed on and/or over the support column 252. At least a portion of the overhang member 256 is disposed on and/or over the guide beam 210 to support the weight of the entirety of the substrate transfer assembly 250. In some embodiments, the actuator (not shown) used to move the substrate transfer assembly 250 along the guiding beam 210 is disposed between the overhang member 256 and the guiding beam 210, so that the moment force enacted on the actuator is minimized and the substrate transfer assembly 250 is more easily moved along the guiding beam 210.

The first rail 260 and the second rail 265 are parallel to one another and are each disposed along at least a portion of the length of the support column 252 in the Z-direction, i.e., orthogonal to the guiding beam 210. In some embodiments, the first rail 260 and the second rail 265 are slide rails and the respective indexer assemblies 275a-b are independently movable therealong by corresponding actuator assemblies 302. Examples of suitable linear actuators include stepper motors, pneumatic motors, servo motors, rack and pinion assemblies, and combinations thereof.

The first substrate indexer assembly 275a and the second substrate indexer assembly 275b are similar to one another and each include the connection shaft 262, a blade assembly 264, and blade actuator assembly 258. Each of the connection shafts 262 are rotatable about an axis A to swing the corresponding substrate indexer assemblies 275a-b between the horizontal and vertical orientations described above. Here, the connection shaft 262 is fixedly coupled to the blade actuator assembly 258 so that rotation of the shaft 262 about the axis A concurrently swivels the corresponding blade actuator assembly 258 by the same angle. The connection shafts 262 are rotated by motors, which may be part of the actuator assemblies 302 or separate from the actuator assemblies 302. Alternatively, an actuator is located within the blade actuator assembly 258 to rotate the blade actuator assembly 258, and thus swivel the blade assembly 264, about the axis A.

The blade assembly 264 is used to pick the substrate from the various modules and units of the cleaning system 110 and to place substrates therein. The blade actuator assembly 258 controls the motion of the blade assembly 264 and enables the opening and closing of the blade assembly 264 to grip a substrate therein. In embodiments herein, the blade assembly 264 includes a first handling blade 304 and a second handling blade 306 such as shown in FIG. 3B.

Here, the first handling blade 304 and the second handling blade 306 are mirror images of each other and are disposed to contact opposite sides of a substrate, such as the substrate 120. The first handling blade 304 is disposed distal from the support column 252 and the second handling blade 306 is disposed proximate to the support column 252. Here, the handling blades 304, 306 are individually coupled to the blade actuator assembly 258, which is used to move the handling blades 304, 306 towards or away from one another to provide a substrate gripping or release motion therebetween.

Figure 4:
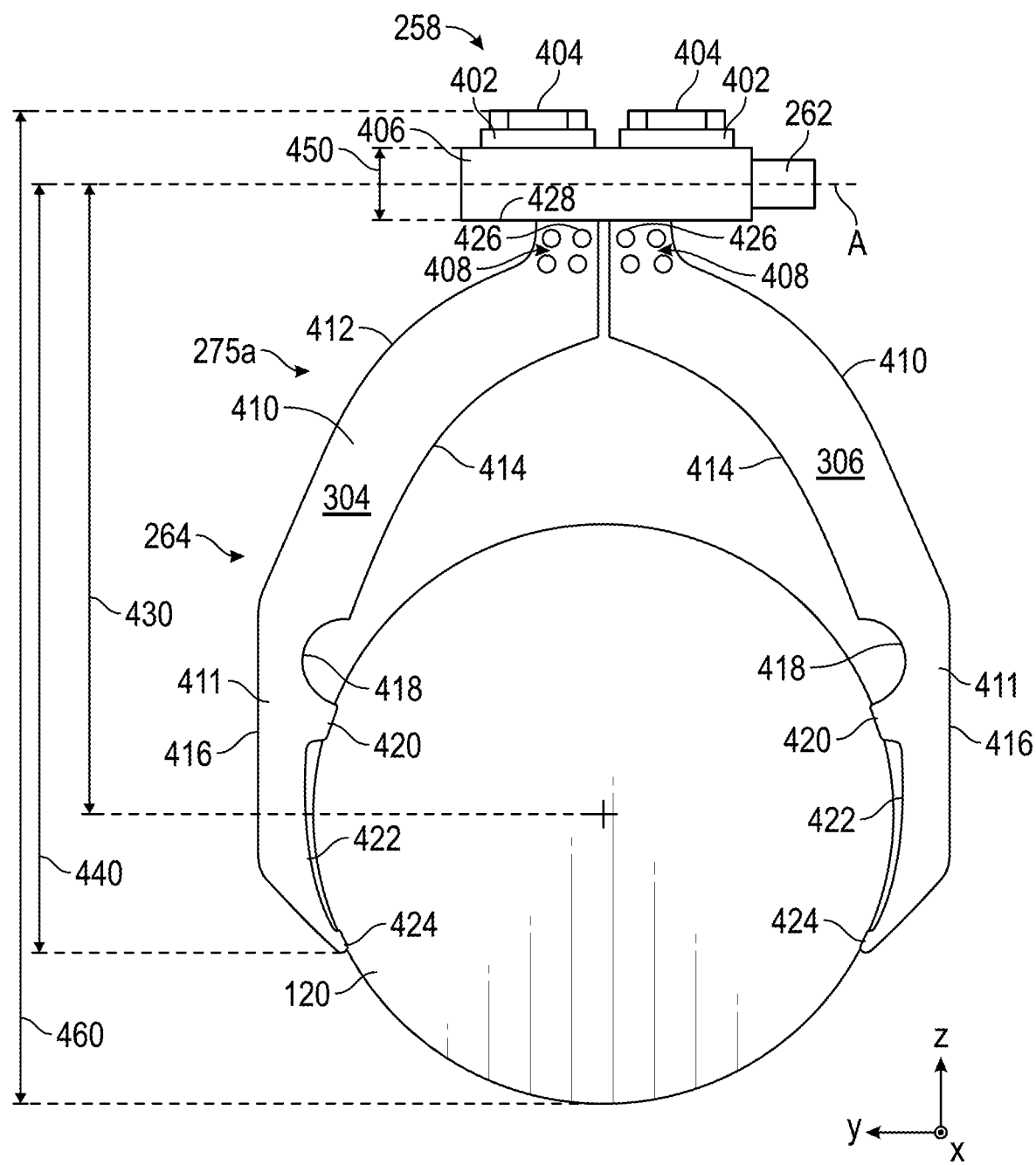
FIG. 4 is a schematic side view of a substrate indexer assembly shown in FIGS. 3A-3B.

FIG. 4 is a close up view of the first substrate indexer assembly 275a shown in FIG. 3B. The substrate indexer assembly 275a illustrated in FIG. 4 is equally representative of the second substrate indexer assembly 275b. Here, the substrate indexer assembly 275b designed to minimize the clearance height required between the HPC module 125 and the vertical cleaning modules 112a-d disposed there beneath and to contain particles which may be undesirably produced by moving parts of the blade actuator assembly 258. Here, the substrate indexer assembly 275a includes an actuator housing 406, the first handling blade 304, the second handling blade 306, the blade actuator assembly 258, the connection shaft 262, a plurality of fasteners 426, one or more opening covers 402, and one or more brackets 404.

Each of the first handling blade 304 and the second handling blade 306 is formed of a unitary body and includes an upper portion 410 and a lower portion 411. The upper portion 410 features an inner surface 414, an outer surface 412, and a coupling region 408.

In the upper portion 410, the inner surface 414 and the outer surface 412 are curved surfaces disposed opposite one another. The inner surface 414 is connected to a curved indent 418 of the lower portion 411, and the outer surface 412 is connected to an outer surface 416 of the lower portion 411. The inner surface 414 and the outer surface 412 are curved away from the blade actuator assembly 258, such that the inner surface 414 and the outer surface 412 are initially disposed underneath the blade actuator assembly 258 at the coupling region 408 and are disposed outwards of underneath the blade actuator assembly 258 as the inner surface 414 contacts the curved indent 418 and the outer surface 412 contacts the outer surface 416 of the lower portion 411. The coupling region 408 is disposed proximate the blade actuator assembly 258 and includes a plurality of through holes in which a plurality fasteners 426 are disposed there through. The coupling region 408 is disposed below the blade actuator assembly 258 when the first substrate indexer assembly 275a is in a vertical orientation. The plurality of fasteners 426, e.g., bolts or screws, couple the brackets 404 to each of the first handling blade 304 and the second handling blade 306. The fasteners 426 facilitate quick change out of the handling blades 304, 306 brackets 404 during maintenance and thus beneficially reduce system down-time. In other embodiments, the brackets 404 are secured to the handling blades 304, 306 using an adhesive.

The lower portion 411 is used to contact and grip a substrate 120 during transport thereof. The lower portion 411 includes a first support finger 420, a second support finger 424, an intermediate surface 422, the curved indent 418, and the outer surface 416. The first support finger 420 and the second support finger 424 are inwardly facing protrusions from the inner surface of the lower portion 411 and are formed to contact the substrate 120 during substrate handling. The intermediate surface 422 faces inwardly and connects the first support finger 420 and the second support finger 424. Typically, the intermediate surface 422 does not contact the substrate 120 during substrate handling. The curved indent 418 is a partial circle and is disposed between the inner surface 414 of the upper portion 410 and the first support finger 420. The radius of curvature of the curved indent 418 is smaller than the radius of curvature of the substrate 120 and the inner surface 414 of the upper portion 410. The curved indent 418 serves to direct stress within the handling blades 304, 306 away from the points of contact with the substrate disposed therebetween.

Dimensions of the handling blades 304, 306 and the blade actuator assembly 258 vary depending upon the size of substrate being transported. While dimensions provided herein are directed towards embodiments which transport 300 mm substrates 202, it is envisioned other dimensions of the handling blades 304, 306 and the blade actuator assembly 258 would have a similar substrate diameter to substrate indexer assembly 275a dimension ratio. Here, a distance 430 measured from the axis A to the center of a substrate 120 secured between the handling blades 304, 306 is within a range from about 250 mm to about 350 mm, such as about 275 mm to about 325 mm, such as about 285 mm to about 315 mm. A height 440 of the handling blades 304, 306 measured from the axis A to an end of the handling blades 304, 306 distal from the axis A is within a range from about 300 mm to about 450 mm, such as about 350 mm to about 400 mm, such as about 360 mm to about 380 mm. In embodiments in which the substrates 120 are diameters other than 300 mm, the substrate 120 diameter to the distance 430 ratio is about 0.85:1, such as about 1.2:1, such as about 0.9:1 to about 1.1:1. The ratio of substrate 120 diameter to height 440 is about 0.65:1:to about 1:1, such as about 0.75:1 to about 0.86:1.

Typically, the blade actuator assembly 258 has a height 450 of about 75 mm or less, such as about 50 mm less. In some embodiments, a combined profile height 460 of both the substrate indexer assembly 275*a* and a 300 mm diameter substrate secured therein is less than about 400 mm, such as less than about 350 mm. The combined profile height 460 includes the full height of the substrate indexer assembly 275*a* as well as a portion of the diameter of the substrate 120 which extends beyond the height of the substrate indexer assembly 275*a* while disposed between the blades 304, 306. Beneficially, the low profile height 460 reduces the clearance height 215 (FIG. 2) between the HPC module 125 and the vertical cleaning modules 112*a-d* required to facilitate substrate movement therebetween. The distance 430 and heights 440, 450 are for a substrate indexer assemblies 275*a-b* configured for handling 300 mm diameter substrates, appropriate scaling may be used for substrate indexer assemblies configured for different sized substrates. Other embodiments described herein may have the same or substantially similar dimensions as the distance 430 and heights 440, 450, and 460 shown in FIG. 4.

Figure 5A:
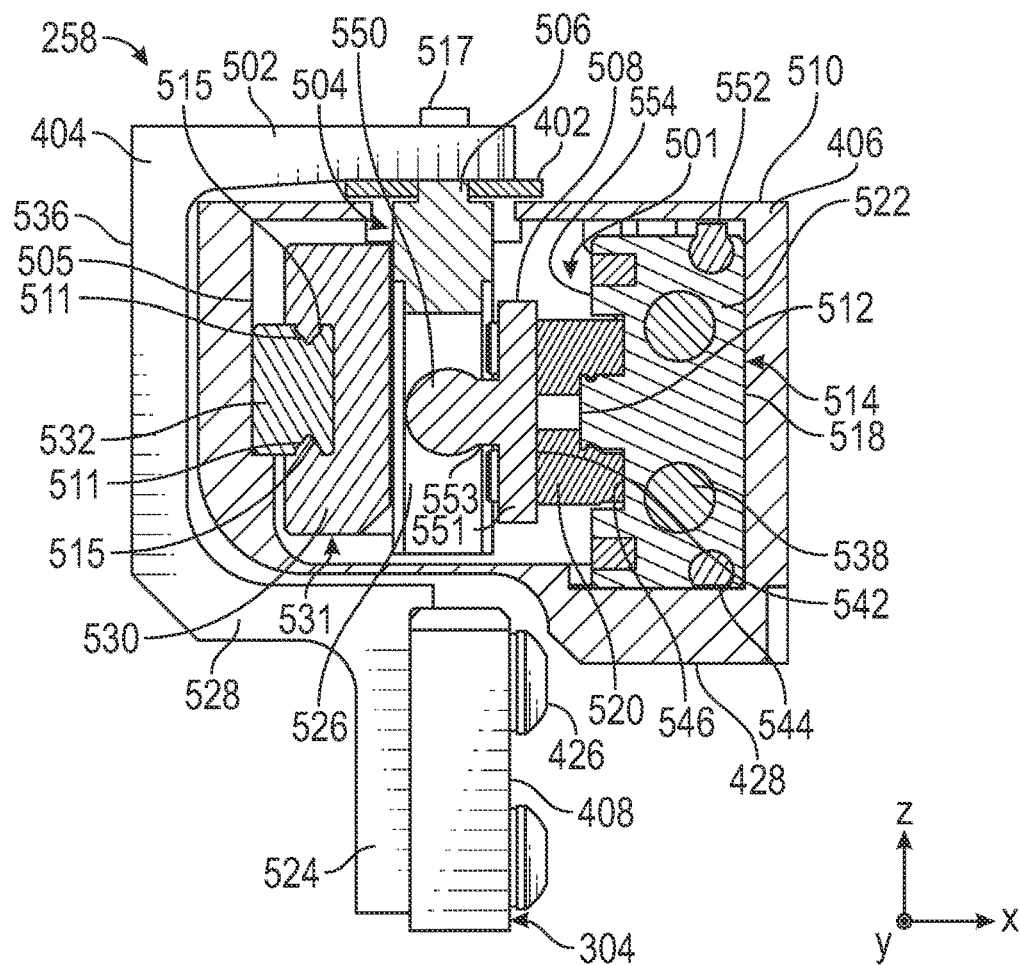
FIG. 5A is a schematic cross sectional side view of a portion of the substrate indexer assembly of FIG. 4.

Typically, the opening covers 402, which surround the brackets 404, are disposed over openings 504 (FIG. 5A). The opening covers 402 move with the brackets 404 and slide along the top of the openings 504 during movement of the first handling blade 304 and the second handling blade 306 to maintain the cover over the openings 504 while the brackets 404 are in different operating positions. The opening covers 402 are used for containing particles generated by the movement of the components inside the actuator housing 406, so that the opening covers 402 prevent the egress of particles through the openings 504.

Beneficially, the substrate indexer assemblies 275*a*, 275*b* have clearance heights small enough to fit between the HPC module 125 and the vertical cleaning modules 112*a-d* to facilitate substrate movement therebetween. The substrate indexer assemblies 275*a*, 275*b* additionally contain the moving components used to enable motion of the first handling blade 304 and the second handling blade 306. The first and second substrate indexer assemblies 275*a*, 275*b* illustrated in FIG. 4 move each of the first handling blade 304 and the second handling blade 306 in a direction parallel to the axis A, such that the first handling blade 304 moves in an opposite direction from the second handling blade 306, e.g., towards or away from one another. Each of the first handling blade 304 and the second handling blade 306 are moved linearly to couple and de-couple from a substrate. The actuator housing 406 contains the moving components of the first and second substrate indexer assemblies 275*a*, 275*b* to minimize particle distribution across the substrate surface from moving components such as an actuator assembly.

FIG. 5A is a schematic cross sectional side view of blade actuator assembly 258 shown in FIG. 4. The blade actuator assembly 258 includes components which enable movement of the first handling blade 304 and the second handling blade 306. Here, the blade actuator assembly 258 enables linear motion of the handling blades 304, 306, which causes each of the first handling blade 304 and the second handling blade 306 to move to an open position or a closed position (move towards each other or away from each other) to release/receive a substrate. The components described herein beneficially reduce the moments acting upon the actuator assemblies and reduce particle release into the area surrounding the blade actuator assembly 258.

Here, the blade actuator assembly 258 includes the brackets 404, the actuator housing 406, a linear actuator 514, a guide rail assembly 531, a plurality of force transfer components 508, and a plurality of coupling members 506 (one shown). The actuator housing 406 includes a top wall 510, a bottom wall 428, and a plurality of side walls, including the first side wall 505 and the second side wall 518, which collectively defined a housing volume 501. The first side wall 505 and the second side wall 518 are disposed opposite and parallel to one another. The top wall 510 and the bottom wall 428 are opposite one another. One or more openings 504 are disposed through the top wall 510 of the actuator housing 406 and covered by opening covers, such as the opening covers 402. The openings 504 are formed through the top wall 510 so that particles generated by moving components within the housing volume 501 are more easily contained by the opening covers 402 and do not escape from the housing volume 501. Beneficially, containing particles generated by the moving components within the housing volume 501 reduces associated defectivity on the substrate surface and/or contamination thereof.

The linear actuator assembly 514, the guide rail assembly 531, the force transfer components 508, and the coupling members 506, are disposed within the housing volume 501. Herein, the handling blades 304, 306 and at least portions of the bracket 404 are disposed outside of the actuator housing 406. In some embodiments, the bracket 404 is disposed completely outside of the actuator housing 406 and is coupled to the coupling member 506.

Figure 5B:
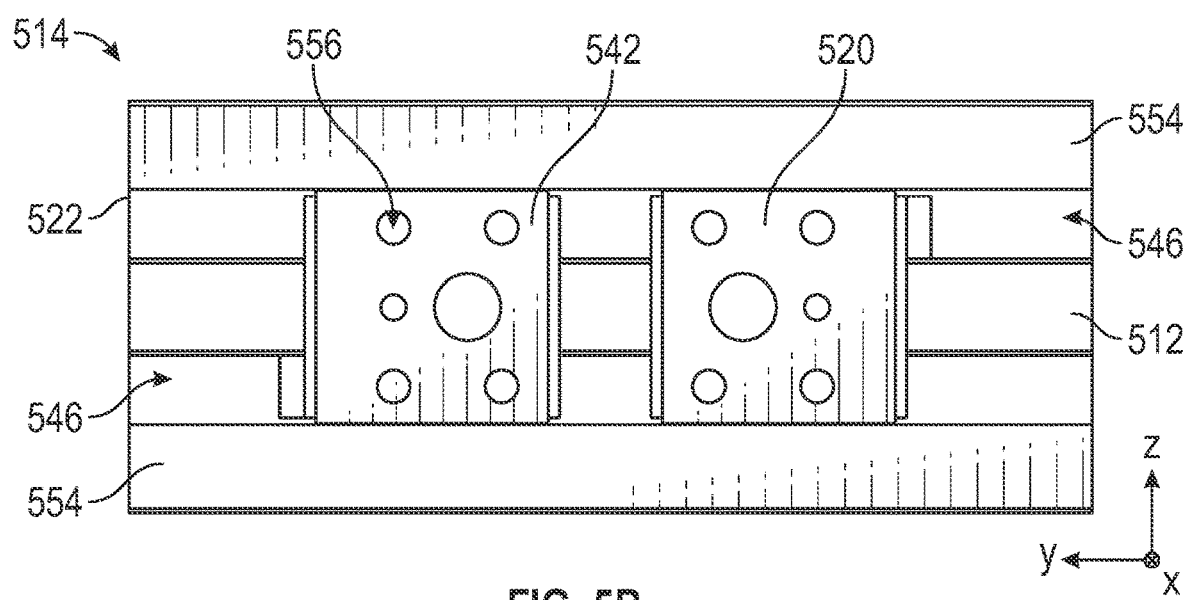
FIG. 5B is a schematic side view, orthogonal to the view of FIG. 5A, of an actuator of the substrate indexer assembly of FIG. 5A.

FIG. 5B is a schematic side view of the linear actuator 514. The view in FIG. 5B is orthogonal to the cross sectional view of FIG. 5A, such that FIG. 5B shows the linear actuator 514 as viewed from the plane 5B shown in FIG. 5A. Referring to FIGS. 5A and 5B, the linear actuator 514 includes an actuator body 522 having a plurality of sliding rail grooves 546 formed therein, a plurality of sliding connection members 520, a first position sensor 552, a second position sensor 544, and a plurality of actuator shafts 538. The linear actuator 514 further includes a first guide rail 512 and a plurality of second guide components 554 that are disposed on opposite sides of the first guide rail 512. The actuator body 522 is disposed adjacent to the second sidewall 518. The actuator body 522 is coupled to the bottom wall 428 and/or the top wall 510 using a plurality of fasteners (not shown). Alternatively, the actuator body 522 is coupled to either of the bottom wall 428 or the top wall 510 by an adhesive. The sliding rail grooves 546 are parallel with one another and are formed in an inwardly facing surface of the actuator body 522 that is opposite of the surface coupled to the second side wall 518. The sliding connection member 520 is partially disposed within the sliding rail grooves 546, such that the sliding connection member 520 moves linearly within the two sliding rail grooves 546. Here, the sliding rail grooves 546 extend along the length of the actuator body 522 and are separated from one another by the first guide rail 512. The sliding connection members 520 are partially disposed within the sliding rail grooves 546, and over the first guide rail 512. The sliding connection members 520 each have a hitch connection surface 542 and fastener openings 556 formed through the hitch connection surface 542. The hitch connection surface 542 is a planar surface and is sized to couple to a force transfer component 508. When coupled to one another, the fastener openings 556 on the hitch connection surface 542 align with hitch fastener openings 572 (FIG. 5D).

The first guide rail 512 extends outward from the actuator body 522 and forms a sidewall of both of the sliding rail grooves 546. The outer guide components 554 are parallel to the first guide rail 512 and similarly extend along the length of the actuator body 522 and outward from the actuator body 522 to form a sidewall of each of the sliding rail grooves 546.

The linear actuator 514 includes two actuator shafts 538. The actuator shafts are disposed within the actuator body 522 and are parallel to the sliding rail grooves 546. Each of the actuator shafts 538 include a moveable piston (not shown). Each of the moveable pistons couples to one of the sliding connection members 520 either mechanically or magnetically. The moveable pistons are translated along the lengths of the actuator shafts 538 using pneumatic force. The actuator shafts 538 may have gas lines leading thereto from which gas is pumped into or out of the actuator shafts 538.

Here, the first position sensor 552 is disposed between the actuator body 522 and the top wall 510 and the second position sensor 544 is disposed between the actuator body 522 and the bottom wall 428. The first position sensor 552 and the second position sensor 544 are configured to detect the position of the actuator and determine when the handling blades 304, 306 are in an open position and when the handling blades 304, 306 are in a closed position. In some embodiment only one of the first position sensor 552 or the second position sensor 544 is utilized. The first and second position sensors 552, 544 are disposed along the length of the actuator body 522 and may operate by detecting the location of a piston within the actuator shafts 538. The location of the piston may be determined electromagnetically.

Figure 5C:
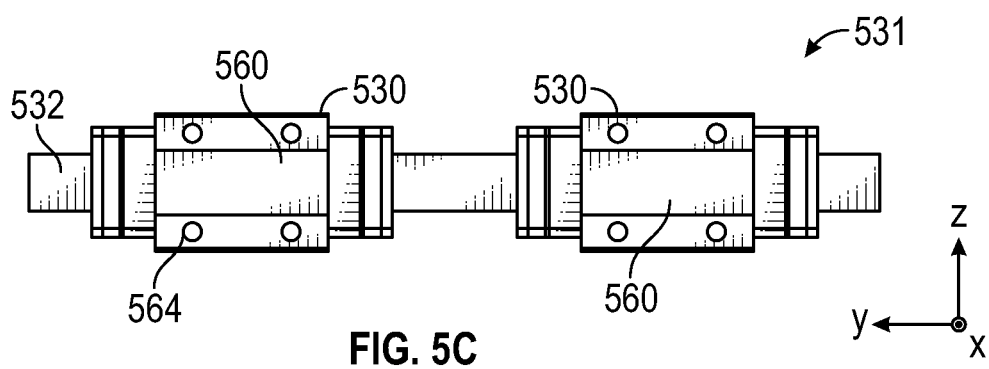
FIG. 5C is a schematic side view, orthogonal to the view of FIG. 5A, of a guide rail assembly of the substrate indexer assembly of FIG. 5A.
Figure 5D:
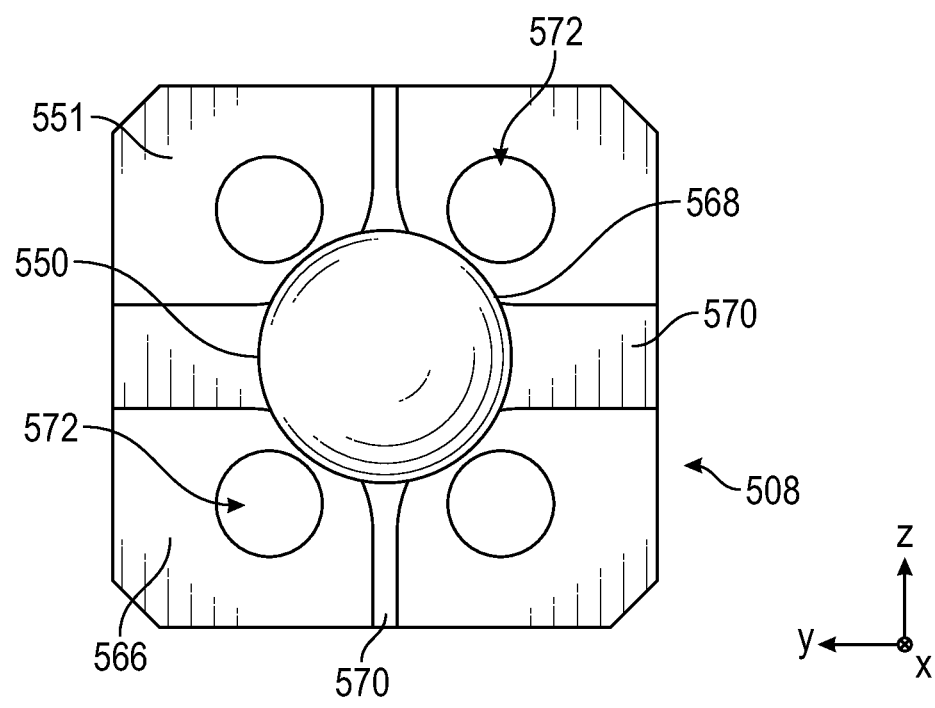
FIG. 5D is a schematic side view, orthogonal to the view of FIG. 5A, of a hitch component of the substrate indexer assembly of FIG. 5A.

FIG. 5C is a schematic side view, orthogonal to the cross sectional view of FIG. 5A, of the guide rail assembly 531. FIG. 5C shows the guide rail assembly 531 as viewed from the plane 5C shown in FIG. 5A. Referring to FIGS. 5A and 5C, a guide rail 532 of the guide rail assembly 531 is coupled to an inward facing surface of the first sidewall 505 (FIG. 5A). The guide rail 532 features parallel grooves 511 formed in opposite and outward facing surfaces thereof. Sliders 530 are movably coupled to the guide rail 532 using a plurality of protrusions 515 extending outwardly from the surfaces thereof, such as shown in FIG. 5A. The sliders 530 slidingly move along the guide rail 532 to impart linear motion to the respective handling blades 304, 306.

As shown in FIG. 5C, the sliders 530 are generally the same or substantially similar and each includes a respective attachment surface 560 having a plurality of fastener openings 564 formed there through. The attachment surfaces 560 face outwardly from the guide rail assembly 531 to provide a mating surface for the hitch connection surface 542 (shown in FIG. 5A) of a corresponding force transfer component 508. Typically, the force transfer components 508 are respectively coupled to the sliders 530 using fasteners (not shown) disposed through corresponding fastener openings 564 formed in the attachment surface 560.

FIG. 5D is a schematic side view, orthogonal to the cross sectional view of FIG. 5A, of the force transfer component 508. FIG. 5D shows the force transfer component 508 as viewed from the plane 5D shown in FIG. 5A. The force transfer component 508 transfers force generated within the linear actuator 514 to each of the coupling members 506 in order to move the handling blades 304, 306. The force transfer component 508 includes a ball protrusion 550 and a component body 551. The ball protrusion 550 is similar to the ball within a trailer hitch ball mount in that there is a neck 553 connecting the ball protrusion 550 to the component body 551 of the force transfer component 508. The neck 553 has a cylindrical shape. The ball protrusion 550 is spherical in shape. Alternatively, the ball protrusion 550 may be an oblong or ovoid shape. Other ball protrusion 550 shapes are envisioned and may also be effective. Here, a surface 556 of the component body 551 is generally rectangular in shape, and the ball protrusion 550 is disposed at or proximate to the center of the surface 556 of the component body 551 and extends outwardly therefrom.

Here, the force transfer component 508 has a plurality fastener openings 572 formed through the component body 551 and a projection 570 extending outwardly from a surface 556 of the component body.

The force transfer component 508 is coupled to the sliding connection member 520 (FIG. 5B) using a plurality of fasteners (not shown), such as bolts or screws, disposed through the plurality of fastener openings 572. When coupled to the sliding connection member 520, the ball protrusion 550 extends in a direction away from the sliding connection member 520 and the linear actuator 514.

A projection 570 is an X-shaped or a cross shaped projection that extends outwardly from the surface 566 of the component body 551. Here, the projection has four segments radiating outward from the center of the component body 551 where the ball protrusion 550 extends and across the primary surface 566 to the edge of the primary surface 566. The projection 570 separates the fasteners disposed through the fastener openings 572 and helps secure the fasteners in place while minimizing the thickness of the force transfer component 508.

Figure 5E:
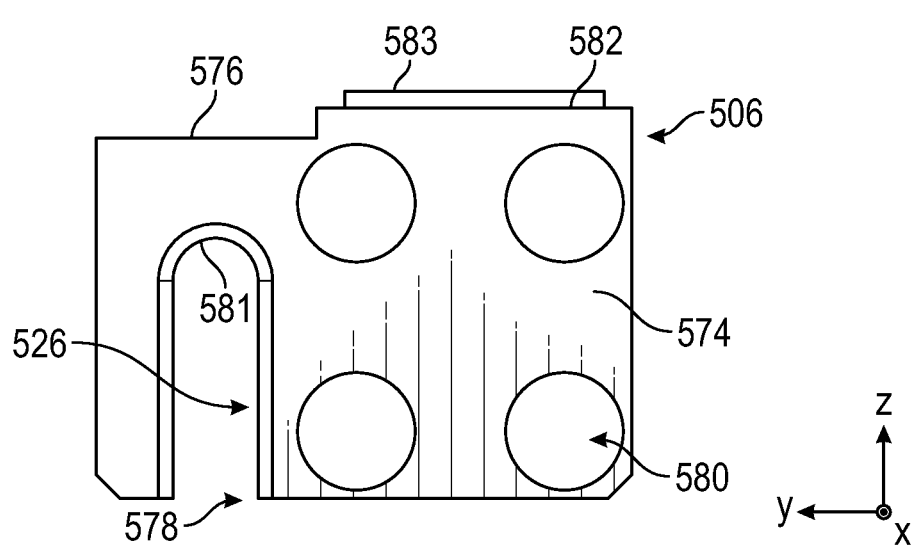
FIG. 5E is a schematic side view, orthogonal to the view of FIG. 5A, of an intermediary component of the substrate indexer assembly of FIG. 5A.

FIG. 5E is a schematic side view, orthogonal to the cross sectional view of FIG. 5A, of a coupling member 506. FIG. 5E shows one of the coupling members 506 as viewed from the plane 5C shown in FIG. 5A. Typically, a plurality of coupling members 506 comprise two coupling members which are mirror images of one another. Thus, the second coupling member 506 is a mirror image of the first coupling member 506 illustrated in FIG. 5E. The first and second coupling members 506 are connected to each of the sliders 530 as illustrated in FIG. 5A. A better understanding of the connection of the coupling members 506 to the sliders 530 and the manner in which the coupling members 506 are mirrored may obtained by referencing the second embodiment of the blade actuator assembly 600 of FIG. 6. The blade actuator assembly 600 of the second embodiment illustrates how two coupling members 605 are connected to each of the sliders 530 and are mirror images of one another. The two coupling members 605 are similar to the two coupling members 506 of the first embodiment. The coupling members 506 are similar in the blade actuator assembly 258 of FIG. 5A, but the coupling members 506 of FIGS. 5A and 5E are flipped over the y-axis, such that a cover receiving surface 582 is disposed adjacent to the openings 504 and the cover receiving surface 582 is separate from the blades 304, 306. Alternatively, the coupling members 506 may additionally be flipped about the z-axis so that the slot shaped openings 526 are disposed on the opposite side and each of the stop shaped openings 526 are separated from each other by the mounting portions 574 of both of the coupling members 506. In embodiments herein, each of the coupling members 506 is respectively coupled to corresponding ones of the plurality of sliders 530 (FIG. 5A). The respective coupling member 506 has force and motion imparted upon it by a corresponding force transfer component 508 operably coupled thereto. The coupling member 506 then transfers the force and motion to the brackets 404 and thus to the handling blades 304, 306 coupled thereto. The coupling members 506 are also attached to the guide rail assembly 531, which supports the coupling members 506. Attaching the coupling members 506 to the guide rail assembly 531 beneficially reduces an amount of torque which would otherwise be exerted on the sliding connection members 520 of the actuator assembly 514 if the guide rail assembly 531 did not hold at least part of the weight of the handling blades 304, 306, the brackets 404, and the coupling members 506. The coupling member 506 is coupled to the sliders 530 using a fastener, such as a bolt or screw. Typically, each coupling member 506 is disposed below the opening 504 and within the actuator housing 406.

As shown in FIG. 5E, the coupling member 506 includes a body comprising a mounting portion 574 and a ball protrusion receiving portion 576 having a slot shaped opening 526 formed therethrough, and a cover receiving surface 582. Typically, a plurality of fasteners (not shown) disposed through a corresponding plurality of fastener openings 580 formed in the mounting portion 574 are used to couple the coupling member 506 to the attachment surface of a slider 530. Thus, when the coupling members 506 are coupled to the sliders 530 the fastener openings 580 thereof are in registration with the fastener openings 564 of the sliders 530.

As shown in FIG. 5E, the ball protrusion receiving portion 576 is an overhand portion, which extends from the mounting portion 574 of the coupling member 506. The slot shaped opening 526 formed in the ball protrusion receiving portion 576 is sized and shaped to receive the ball protrusion 550 of the force transfer component 508. For example, here the slot shaped opening 526 has a general U-shape having an open end 578 and a closed end 581. The slot shaped opening 526 enables the ball protrusion 550 disposed therein to enact a force on the coupling member 506, while beneficially allowing for at least some linear or rotational relative motion between the coupling member 506 and the force transfer component 508.

The cover receiving surface 582 features a protrusion 583 extending upwardly therefrom. The protrusion 583 is typically sized and shaped to receive one of the corresponding plurality of opening covers 402, so that the opening covers 402 are secured to the cover receiving surface 582 as the coupling members 506 move relative to the actuator housing 406. Typically, the opening covers 402 are longer than the range of linear motion of the coupling members 506 with respect to the actuator housing so that the opening covers 402 always cover the openings 504 in the actuator housing 406 during operation of the blade actuator assembly 258. As shown in FIG. 5A, the brackets 404 are coupled to the cover receiving surface 582 of the coupling member 506 using a plurality of fasteners 517.

The opening covers 402 are disposed over the top wall 510 of the actuator housing 406 of the blade actuator assembly 258 and move along with the coupling member 506 to cover the openings 504 through the actuator housing 406. Because the opening covers 402 are attached to the coupling member 506 and move with the coupling member 506.

The brackets 404 are generally C-shaped in profile (FIG. 5A) and are used to couple one of the corresponding coupling members to a respective handling blade 304 or 306. As shown in FIG. 5A, the bracket 404 includes a first portion 502, a second portion 536, a third portion 528, and a fourth portion 524. The first portion 502 of the bracket is a horizontal portion, which extends over the top wall 510 and the opening 504. The first portion 502 is coupled to a respective one of the coupling members 506 using a plurality of fasteners 517. On the distal end of the first portion 502 opposite the coupling to the coupling members 506, the second portion 536 extends from the first portion 502. The second portion 536 is a vertical portion extending downward around the side of the actuator housing 406. The second portion 536 is disposed perpendicular to the first portion 502. On the distal end of the second portion 536 opposite the first portion 502 the third portion 528 is disposed.

The third portion 528 extends from the bottom end of the second portion 536 in a horizontal direction, such that the third portion 528 extends along and underneath the bottom wall 428. The third portion 528 is perpendicular to the second portion 536, such that the first portion 502 and the third portion 528 extend in a similar direction and are about parallel to one another. The fourth portion 524 extends from the distal end of the third portion 528 opposite the second portion 536. The fourth portion 524 extends vertically downward from the third portion 536 and is parallel to the second portion 536. The fourth portion 524 extends away from the bottom wall 428 of the actuator housing 406. The fourth portion 524 may include through holes for fastening the first or second handling blade 304, 306 thereon. The coupling region 408 of the first or second handling blade 304, 306 is attached to the fourth portion 524 of the bracket 404 using a plurality of fasteners 426.

The assembly of the linear actuator 514, the guide rail assembly 531, the force transfer component 508, and coupling members 506 inside of the actuator housing 406 reduce the moment and torque exerted on the linear actuator 514 and the guide rail assembly 531 and contain the moving components used to enable motion of the first handling blade 304 and the second handling blade 306. The embodiment of the blade actuator assembly 258 of the first and second substrate indexer assemblies 275a, 275b illustrated in FIGS. 5A-5E moves the first handling blade 304 and the second handling blade 306 in a horizontal direction, such that the first handling blade 304 moves in an opposite direction from the second handling blade 306. Each of the first handling blade 304 and the second handling blade 306 are moved linearly to couple and de-couple from a substrate.

Figure 6:
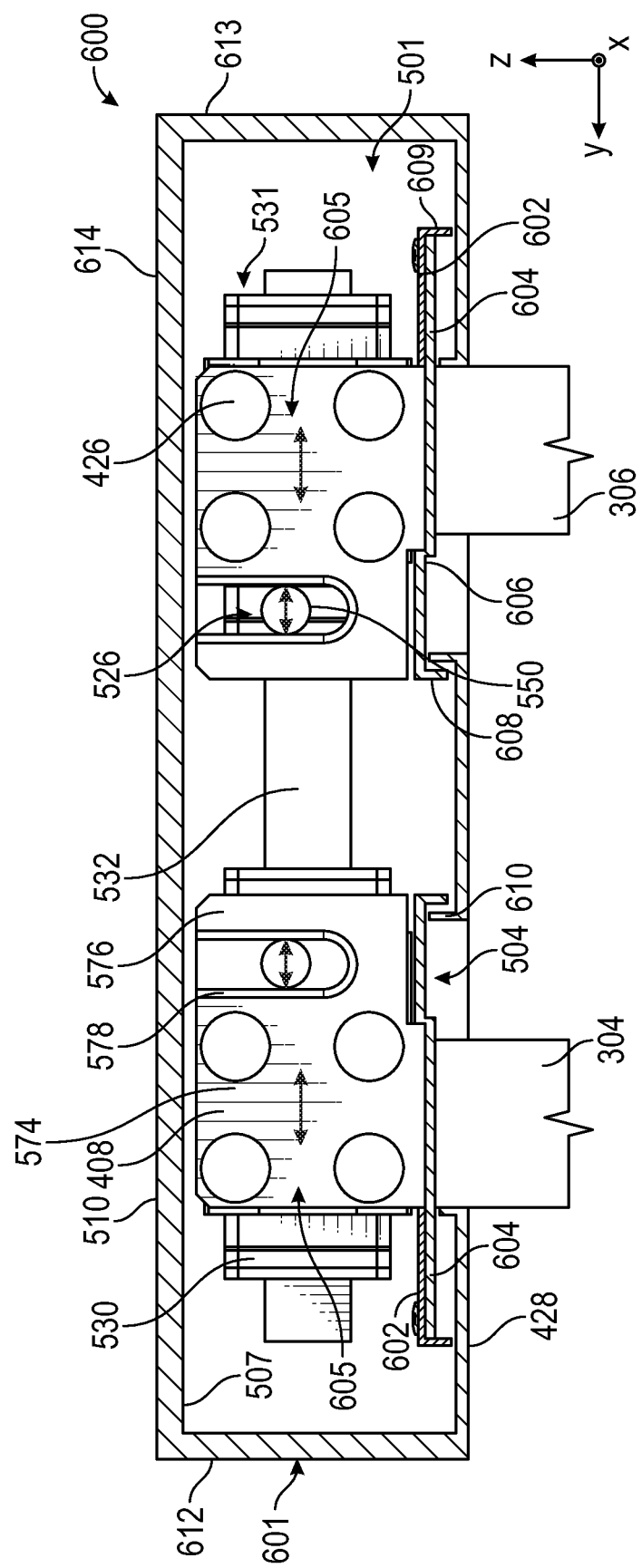
FIG. 6 is a schematic cross sectional side view of a portion of a substrate indexer assembly, according to another embodiment, which may be used with the substrate transfer assembly of FIGS. 3A-3B.

FIG. 6 is a schematic cross sectional side view of an alternate embodiment of a blade actuator assembly 600, which may be used with the substrate transfer assembly 250 of FIGS. 3A-3B. Like, the blade actuator assembly 258 described above, the blade actuator assembly 600 desirably reduces the moments acting upon the individual components thereof and reduces or substantially eliminates particle release into the surrounding processing area by containing moving components within an actuator housing 601.

Here, the blade actuator assembly includes the actuator housing 601, a linear actuator 514 (FIG. 5B), the force transfer components 508 (FIG. 5D), and a guide rail assembly 531. The actuator housing 601 includes a top wall 614, a plurality of sidewalls including a first sidewall 612 and a second sidewall 613, and a bottom wall 428 which collectively define a housing volume 501. The linear actuator 514 is not shown in the cross section of FIG. 6, but is coupled to the force transfer components 508 in a manner similar to that shown in FIG. 5A. The ball protrusion 550 of the force transfer component 508 is illustrated within the slot shaped opening 526 of the coupling members 605. The guide rail assembly 531 is the same or substantially similar as described above in FIGS. 5A and 5C. Here, the coupling members 605 are directly or indirectly coupled to the handling blades 304, 306 without the use of the C-shaped bracket 404 coupled therebetween. In some embodiments, the coupling members 605 are part of the handling blades 304, 306 and the coupling members 605 and the handling blades 304, 306 are formed from the same material. In some embodiments, the coupling members 605 are an extension of the handling blades 304, 306, such that the coupling region 408 of the handling blades of FIGS. 4 and 5A are replaced with the coupling members 605. Thus, in some embodiments, at least portions of the handling blades 304, 306 are disposed through openings 504 formed through the bottom wall 428 of the actuator housing.

Here, the openings 504 are covered using a cover assembly 606. The cover assembly 606 includes a first cover member 602 and a second cover member 604. The first cover member 602 and the second cover member 604 are coupled together using a fastener, such as a bolt. The first cover member 602 and the second cover member 604 are disposed around the upper portion 410 of the handling blades 304, 306. The second cover member 604 may have a slit (not shown) disposed therein, which fits snuggly around the upper portion 410 of the handling blades 304, 306. The open end of the slit is covered by the first cover member 602, such that when the first cover member 602 and the second cover member 604 are coupled together, the upper portion 410 of the handling blades 304, 306 are surrounded by the cover assembly 606. The cover assembly 606 is larger than the openings 504, such that when the handling blades 304, 306 move, the cover assembly 606 can move with the handling blades 304, 306 without providing a gap from which particles could escape from the housing volume 501.

First protrusions 610 may be formed around the edge of the openings 504 and extend into the housing volume 501. Second protrusions 608 are formed as part of the first cover member 602 and third protrusions 609 are formed as part of the second cover member 604. The second protrusions 608 and the third protrusions 609 extend from the first cover member 602 and the second cover member 604 respectively, such that the second protrusions 608 and the third protrusions 609 vertically overlap the first protrusions 610 and close off any gap between the cover assembly 606 and the openings 504 within the housing volume 501.

Figure 7A:
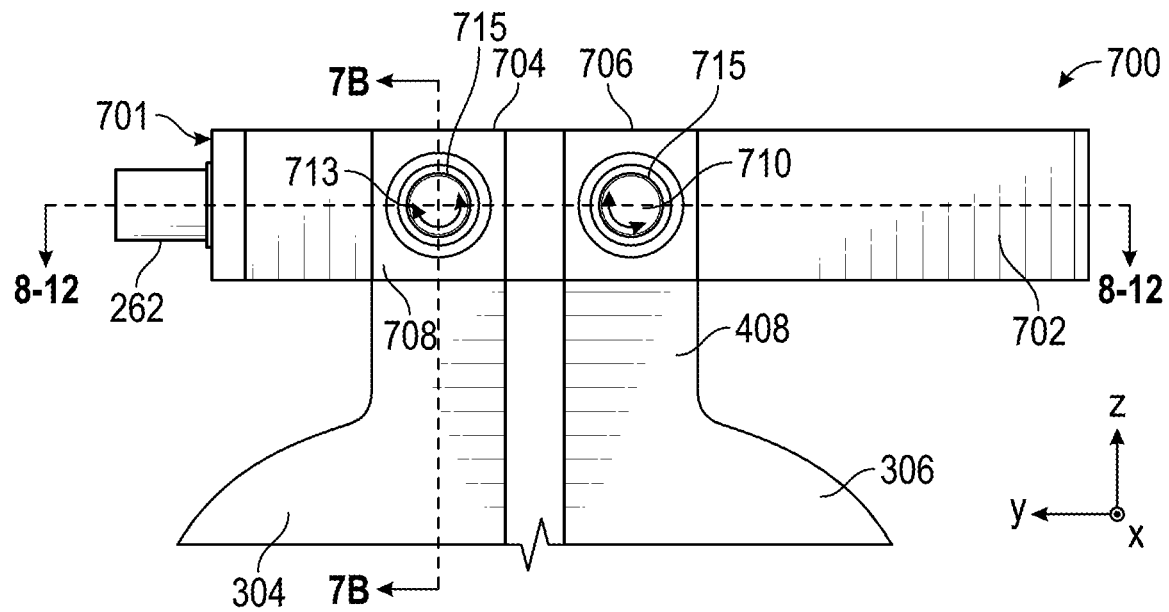
FIG. 7A is a schematic side view of a portion of a substrate indexer assembly, according to another embodiment, which may be used with the substrate transfer assembly of FIGS. 3A-3B.
Figure 7B:
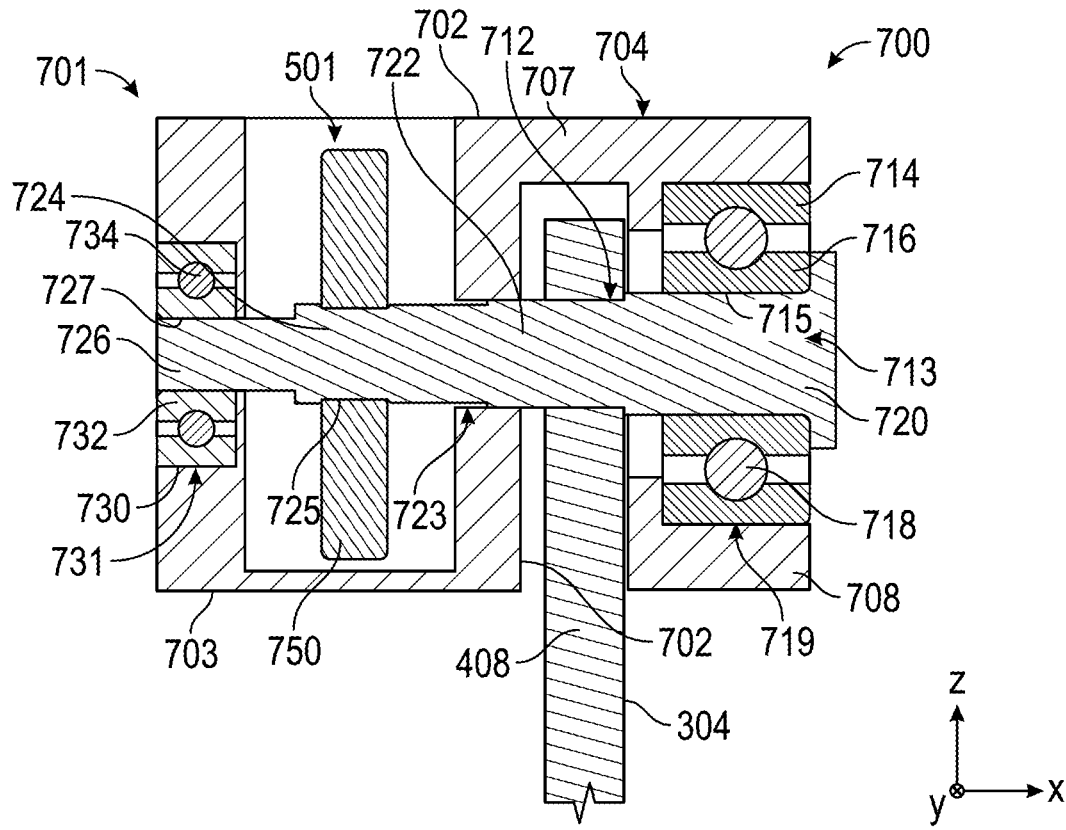
FIG. 7B is a schematic cross sectional side view of a portion of the substrate indexer assembly of FIG. 7A.

FIG. 7A is a schematic side view of an alternate embodiment of a blade actuator assembly 700, which may be used with the substrate transfer assembly 250 of FIGS. 3A-3B. FIG. 7B is a schematic cross sectional side view of FIG. 7A taken along line 7B-7B. Here, the blade actuator assembly 700 is configured to pivot each of the first handling blade 304 and the second handling blade 306 about a respective axis to facilitate handling of a substrate disposed therebetween. For example, the first handling blade 304 is swung about a first shaft 713 and the second handling blade 306 is swung about a second shaft 710 to move the first handling blade 304 and the second handling blade 306 away or towards one another, e.g., between an open position and a closed position. The handling blades 304, 306 are in an open position when the handling blades 304, 306 are not in contact with a substrate and are swung outwards and away from one another. The handling blades 304, 306 are in a closed position when the handling blades 304, 306 are contacting the edges of the substrate. Opening and closing the first handling blade 304 and the second handling blade 306 allows the first and second substrate indexer assemblies 275a, 275b to release/receive a substrate.

Here, the blade actuator assembly 700 includes an actuator housing 701, the first shaft 713, the second shaft 710, a first blade enclosure 704, and a second blade enclosure 706.

The actuator housing 701 includes a first side surface 702 and at least portions of the first and second shafts 713, 710 extend outwardly therefrom. Additionally, the first blade enclosure 704 and the second blade enclosure 706 extend from the first side surface 702 of the actuator housing 701. The handling blades 304, 306 are respectively coupled to the first shaft 713 and the second shaft 710 at a location disposed within a coupling region 408.

The first shaft 713 is disposed through an opening 715 within the first blade enclosure 704 and the second shaft 710 is disposed through an opening 715 within the second blade enclosure 706. As shown in FIG. 7B, the first shaft 713 and the second shaft 710 are linear shafts. The first shaft 713 passes through an opening 723 within the first side surface 702 of the actuator housing 701 before passing through a blade support opening 712, which is disposed through the coupling region 408 of the first handling blade 304. Similarly, the second shaft 710 passes through an opening 723 within the first side surface 702 of the actuator housing 701 before passing through a blade support opening 712, which is disposed through the coupling region 408 of the second handling blade 306. The first shaft 713 then passes through the opening 715 within the first blade enclosure 704. Similarly, the second shaft 710 then passes through the opening 715 within the second blade enclosure 706. The coupling regions 408 of the first handling blade 304 and the second handling blade 306 are disposed between the first side surface 702 of the actuator housing 701 and the first and second blade enclosures 704, 706 respectively.

FIG. 7B is a schematic cross sectional side view of the substrate blade actuator assembly 700 of FIG. 7A. The blade actuator assembly 700 includes the first handling blade 304, the actuator housing 701, the first shaft 713, the first blade enclosure 704, an action attachment 750, a blade enclosure bearing assembly 719, and a containment body bearing assembly 731.

The actuator housing 701 includes the first side surface 702, a second side surface 703, the inner actuator assembly volume 501, the first blade enclosure 704, and the second blade enclosure 706. The second blade enclosure 706 is not shown in FIG. 7B, but is similar to the first blade enclosure 704. The first blade enclosure 704 is projected from the first side surface 702. Openings 723 are formed through the first side surface 702 and openings 727 are formed through the second side surface 703.

The first blade enclosure 704 includes a first portion 707 and a second portion 708. The first portion 707 extends outward from the top of the first side surface 702 of the actuator housing 701, such that the first portion 707 extends from a distal end of the first side surface 702 opposite the direction in which the first handling blade 304 is disposed. The first portion 707 is a horizontal portion, such that the first portion 707 projects in a normal direction outward from the first side surface 702. The second portion 708 is attached to the first portion 707 at a distal end of the first portion 707 away from the first side surface 702. The second portion 708 is projected downward from the first portion 707 and is normal to the first portion 707. The second portion 708 is disposed parallel to the first side surface 702 of the actuator housing 701 and extends from the first portion 707 in a similar direction as the first side surface 702.

The second portion 708 of the first blade enclosure 704 includes the blade enclosure bearing assembly 719 disposed therein. The blade enclosure bearing assembly 719 is sized to receive the first shaft 713 and hold the first shaft 713. The blade enclosure bearing assembly 719 is, e.g., a ball bearing assembly and includes an opening 715 through which the first shaft 713 is disposed. The blade enclosure bearing assembly 719 includes an outer portion 714, an inner portion 716, and a ball portion 718. The outer portion 714 is disposed within the second portion 708 of the first blade enclosure 704 and is coupled thereto. The inner portion 714 includes the opening 715 and is sized to receive the first shaft 713. The ball portion 718 is a plurality of balls, which rotate and move to enable rotation of the first shaft 713 and therefore the first handling blade 304. The outer portion 714 and the inner portion 716 of the blade enclosure bearing assembly 719 at least partially encloses the ball portion 718 to prevent particles generated by the movement of the ball portion 718 from escaping and being deposited on the substrate during handling.

The opening 723 within the first side surface 702 of the actuator housing 701 is similarly sized to receive a portion of the first shaft 713. The opening 723 is not shown to include a bearing assembly disposed therein, but in some embodiments, may have a bearing assembly disposed therein to assist in supporting the first shaft 713. The opening 713 is sized such that the walls of the opening 713 do not contact the first shaft 713 to reduce friction, which would prevent rotation of the first shaft 713. The opening 713 has a similar diameter as the second portion 722 of the first shaft 713 and the second shaft 710.

The second side surface 703 includes the containment body bearing assembly 731 disposed therein. The containment body bearing assembly 731 is sized to receive a portion of the first shaft 713. The containment body bearing assembly 731 includes an outer portion 730, an inner portion 732, and a ball portion 734. The outer portion 730 is disposed within the second side surface 703 and is coupled thereto. The inner portion 732 includes the opening 727 and is sized to receive a portion of the first shaft 713. The ball portion 734 is a plurality of balls, which rotate and move to enable rotation of the first shaft 713 and therefore the first handling blade 304. The outer portion 730 and the inner portion 732 of the containment body bearing assembly 731 at least partially enclose the ball portion 734 to prevent particles generated by the movement of the ball portion 734 from escaping and being deposited on the substrate during handling.

The action attachment 750 is disposed within the inner actuator assembly volume 501. The action attachment 750 includes an action opening 725 disposed therethrough. The action opening 725 of the action attachment 750 is attached to and disposed around a portion of the first shaft 713, which passes through the inner actuator assembly volume 501. The action attachment 750 enacts a rotational force on the first shaft 713 and enables the movement of the first shaft 713 and therefore the first handling blade 304. The action attachment 750 may change in shape and the method of movement. Embodiments of how the action attachment 750 are shaped and moved is shown in FIG. 8 and FIG. 9.

The first handling blade 304 is attached to the first shaft 713 through a blade support opening 712 formed through the coupling region 408. The blade support opening 712 and the coupling region 408 are disposed between the second portion 708 of the first blade enclosure 704 and the first side surface 702. The use of a bearing on both sides of the first handling blade 304 reduces unwanted torque exerted by the weight of the first handling blade 304 on the first shaft 713. Any torque which is not enacted around a central or rotational axis or along the length of the first shaft 713 is generally undesirable. Minimizing the unwanted torque exerted on the first shaft 713 by the weight of the first handling blade 304 prevents the containment body bearing assembly 731 and the blade enclosure bearing assembly 719 from binding.

The first shaft 713 is a linear shaft, but changes in diameter along the length of the first shaft 713. The first shaft 713 includes a first portion 720, a second portion 722 adjacent to the first portion 720, a third portion 724 adjacent to the second portion 722, and a fourth portion 726 adjacent to the third portion 724. The diameter of the first portion 720 is larger than the diameter of the second portion 722. The diameter of the second portion 722 is larger than the diameter of the third portion 724. The diameter of the third portion 724 is larger than the diameter of the fourth portion 726. The first portion 720 is disposed through the opening 715 of the blade enclosure bearing assembly 719. The second portion 722 is disposed through the blade support opening 712 and a portion of the opening 723 through the first side surface 702. Part way through the opening 723 through the first side surface 702, the diameter of the first shaft 713 changes from the second portion 722 to the third portion 724. The third portion 724 extends through part of the opening 723 through the first side surface 702 and through the action opening 725 within the action attachment 750. The third portion 724 transitions to the fourth portion 726 before the fourth portion 726 passes through the opening 727 disposed through the containment body bearing assembly 731 of the second side surface 703.

The transitions between each of the first portion 720, the second portion 722, the third portion 724, and the fourth portion 726 are hard transitions, such that the diameter of the first shaft 713 changes almost instantly and the transition is normal to the surface of the first shaft 713. In some embodiments, the transitions may be soft transitions and have a slope other than infinity. The transition between the second portion 722 and the third portion 724 is completed within the opening 723 through the first side surface 702 in order to increase the cross sectional area of the opening 723, which is filled by the first shaft 713 near the exit of the opening 723 toward the first handling blade 304, while minimizing the interaction between the first shaft 713 and the opening 723.

The apparatus for moving and supporting the second handling blade 306 is similar to the apparatus for moving and supporting the first handling blade 304 described above. In the apparatus described in FIG. 7B, the second handling blade 306 is supported in the same manner, but the first shaft 713 is replaced by the second shaft 710, the first blade enclosure 704 is replaced with the second blade enclosure 706, and the first handling blade 304 is replaced with the second handling blade 306.

The embodiment of FIGS. 7A-7B enables reduced clearance height of the first and second substrate indexer assemblies 275a, 275b and contain the moving components within the actuator housing 701. Containing the moving components such as the action attachments 750 reduces the amount of particles deposited on a substrate during transportation compared to if the action attachments 750 were not enclosed.

FIG. 8 is a schematic cross sectional side view of an actuator assembly, according to another embodiment, which may be used in the substrate indexer assembly of FIGS. 7A-7B. The blade actuator assembly 700 is described and has a linked assembly approach to utilize a single actuator while moving both of the first handling blade 304 and the second handling blade 306 simultaneously. The blade actuator assembly 700 according to the embodiment of FIG. 8 includes the actuator housing 701, two action attachments 750, an actuator 800, and a link 812. Each of the action attachments 750 have an action opening 725 formed therethrough and the first shaft 713 and the second shaft 710 are disposed through the action openings 725. Each of the action attachments 750, the actuator 800, and the link 812 are disposed within the inner actuator assembly volume 501.

The action attachments 750 include a first action attachment 811 and a second action attachment 813. The first action attachment 811 and the second action attachment 813 are disposed adjacent one another and are coupled by the link 812. The first action attachment 811 is attached to the first shaft 713 and the second action attachment 813 is attached to the second shaft 710. Each of the first action attachment 811 and the second action attachment 813 are circular disks, such that the first action attachment 811 and the second action attachment 813 are cylindrical in shape. The action opening 725 for the first shaft 713 is disposed through the center of the major axis of the first action attachment 811. The action opening 725 for the second shaft 710 is disposed through the center of the major axis of the second action attachment 813. The first action attachment 811 additionally includes a first attachment point 814 disposed on one of the planar side surfaces of the first action attachment 811. The second action attachment 813 additionally includes a second attachment point 816 disposed on one of the planar side surfaces of the second action attachment 813.

The link 812 is coupled to the first action attachment 811 by the first attachment point 814 and the second action attachment 813 by the second attachment point 816. The link 812 is a linear attachment disposed between and coupling the first action attachment 811 and the second action attachment 813. The link 812 is greater in length than the distance between the first action attachment 811 and the second action attachment 813, such that the link 812 couples to both of the first attachment point 814 and the second attachment point 816. The link 812 is disposed diagonally between the first action attachment 811 and the second action attachment 813, such that the link 812 couples to the first attachment point 814 along the top half of the first action attachment 811 and the link 812 couples to the second attachment point 816 along the bottom half of the second action attachment 813.

When the second action attachment 813 is rotated by the actuator 800, in a counterclockwise direction, the second attachment point 816 additionally rotates in a counterclockwise direction. The movement of the second attachment point 816 in a counterclockwise motion moves the link 812 and the link 812 transfers the motion to the first action attachment 811, such that the first action attachment 811 moves in a clockwise direction. When the first action attachment 811 moves in a clockwise direction and the second action attachment 813 moves in a counterclockwise direction, the first handling blade 304 and the second handling blade 306 are moved apart to an open position. The open position is used for releasing or receiving a substrate.

Alternatively, when the second action attachment 813 is rotated by the actuator 800 in a clockwise direction, the second attachment point 816 moves in a clockwise direction. The movement of the second attachment point 816 imparts motion onto the link 812, which transfers the motion to the first action attachment 811. The first action attachment 811 then moves in a counterclockwise direction. When the first action attachment 811 moves in a counterclockwise direction and the second action attachment 813 move in a clockwise direction, the first handling blade 304 and the second handling blade 306 are moved together into a closed position. The closed position is used for holding the substrate in place.

Alternatively, the link 812 is disposed diagonally between the first action attachment 811 and the second action attachment 813, such that the link 812 couples to the first attachment point 814 along the bottom half of the first action attachment 811 and the link 812 couples to the second attachment point 816 along the top half of the second action attachment 813. This embodiment would have a similar result while rotating the second action attachment 813 either clockwise or counterclockwise.

The actuator 800 includes an actuator module 806, a securing portion 804, an actuator rod 808, and a drive connection 810. The actuator module 806 of the actuator 800 is secured in place within the inner actuator assembly volume 501 of the actuator housing 701 using the securing portion 804. The securing portion 804 is a bracket or other assembly, which secures the actuator module 806 in place inside of the actuator housing 701. The securing portion 804 secures the actuator module 806 by coupling the actuator module 806 to a wall of the actuator housing 701.

The actuator module 806 enables movement of the actuator rod 808. The actuator module 806 may be a linear actuator and may include a motor, a drive chain, a ball screw, a ball nut, and a guide. The actuator rod 808 may be disposed within the guide of the actuator module 806. The actuator rod 808 is moved linearly using the actuator module 806. The drive connection 810 is disposed on the distal end of the actuator rod 808 opposite the actuator module 806. The drive connection 810 is coupled to second action attachment 813 at a third attachment point 818. The third attachment point 818 is disposed on the same surface of the second action attachment 813 as the second attachment point 816. The third attachment point 818 is disposed on the opposite side of the surface as the second attachment point 816, such that the third attachment point 818 is on the opposite side of the action opening 725 of the second action attachment 813. The drive connection 810 may be secured to the actuator rod 808 at a pivot point, such that the drive connection 810 may pivot slightly to account for upwards or downward translation of the third attachment point 818 as the third attachment point 818 rotates around the action opening 725.

The first action attachment 811 and the second action attachment 813 will not complete a full rotation during movement of the first handling blade 304 or the second handling blade 306. The actuator module 806 is powered by an outside source (not shown). In some embodiments, the actuator module 806 is an electrical actuator. In yet other embodiments, the actuator module 806 is a hydraulic actuator or a pneumatic actuator.

The actuator assembly of FIG. 8 links the movement of the first handling blade 304 and the second handling blade 306 so that they pivot about the first shaft 713 and the second shaft 710 respectively. The actuator 800, the first action attachment 811, and the second action attachment 813 are all contained by the actuator housing 701 to reduce the dispersion of particles on a substrate during transfer. Additionally, the use of two pivot points disposed within the actuator housing 701 reduces the clearance height of the overall first and second substrate indexer assemblies 275a, 275b.

FIG. 9 is a schematic cross sectional side view of an actuator assembly, according to another embodiment, which may be used with the substrate indexer assembly 275a, 275b of FIG. 7A-7B. The blade actuator assembly 700 is described and utilizes a meshed assembly with either two actuators or a single actuator with a damping component while moving both of the first handling blade 304 and the second handling blade 306. The action attachments 750 described herein include an interlaced interface, which couples the movement of the first handling blade 304 to the second handling blade 306 and vice versa. The blade actuator assembly 700 according to the embodiment of FIG. 9 includes the actuator housing 701, action attachments 750, a first actuator 900, and a second actuator 901. Each of the action attachments 750 include an action opening 725 through which the first shaft 713 and the second shaft 710 are disposed. Each of the action attachments 750 and the first and second actuators 900, 901 are disposed within the inner actuator assembly volume 501.

The action attachments 750 include a first action attachment 911 and a second action attachment 913. The first action attachment 911 and the second action attachment 913 are disposed adjacent one another. The first action attachment 911 includes a first section 902 and a second section 906. The first section 902 extends from the action opening 725 toward the second action attachment 913. The second section 906 extends away from the second action attachment 913 and towards an upper wall, such that the second section 906 is disposed at an obtuse angle of between about 100 degrees and about 170 degrees with respect to the first section 902. The first section 902 includes a first set of teeth 912 disposed on an end of the first section 902. The second section 906 includes a first actuator coupling point 914. The first actuator coupling point 914 is a point, which couples to the first actuator 900.

The second action attachment 913 includes a first section 904 and a second section 908. The first section 904 extends from the action opening 725 toward the first action attachment 911. The second section 908 extends away from the first action attachment 911 and towards an upper wall, such that the second section 908 is disposed at an obtuse angle of between about 100 degrees and about 170 degrees with respect to the first section 904. The first section 904 includes a second set of teeth 910 disposed on an end of the first section 904. The second section 908 includes a second actuator coupling point 916. The second actuator coupling point 916 is a point, which couples to the second actuator 901.

The first set of teeth 912 and the second set of teeth 910 contact one another and interlock. The first set of teeth 912 and the second set of teeth 910 may act as two interlocking sets of gear teeth. The first set of teeth 912 and the second set of teeth 910 interlocking cause both of the action attachments 750 to move with any movement of either of the first action attachment 911 or the second action attachment 913. The first action attachment 911 will move in a clockwise direction if the second action attachment 913 rotates in a counterclockwise direction. Inversely, the first action attachment 911 will move in a counterclockwise direction if the second action attachment 913 rotates in a clockwise direction.

The first and the second actuators 900, 901 are the same, but are mirror images of one another. Each of the first and the second actuators 900, 901 include an actuator module 930, an actuator rod 922, and an adapter 918. The first actuator 900 couples to the first actuator coupling point 914. The first actuator 900 is disposed away from the second action attachment 913. The first actuator 900 is attached to the actuator housing 701 at a first pivot point 934. The first pivot point 934 is disposed through a portion of the actuator module 930 and attaches the first actuator 900 to the actuator housing 701.

The second actuator 901 couples to the second actuator coupling point 916. The second actuator 901 is disposed away from the first action attachment 911. The second actuator 901 is attached to the actuator housing 701 at a second pivot point 936. The second pivot point 936 is disposed through a portion of the actuator module 930 and attached the second actuator 901 to the actuator housing 701.

The use of pivot points, such as the first and second pivot point 934, 936 allows for the first actuator 900 and the second actuator 901 to be secured within the actuator housing 701 while allowing the first actuator 900 and the second actuator 901 freedom to rotate with the first action attachment 911 and the second action attachment 913.

The actuator module 930 is a linear actuator, such that the actuator module 930 includes a motor, a drive chain, a ball screw, a ball nut, and a guide. The actuator rod 922 couples to and is partially disposed within the actuator module 930. The actuator rod 922 is linear and is driven by the actuator module 930 to extend or retract into the actuator module 930. The adapter 918 couples to the end of the actuator rod 922 and couples to actuator rod 922 to the first or second actuator coupling point 914, 916. The first actuator 900 is attached to the first actuator coupling point 914 and the second actuator 901 is attached to the second actuator coupling point 916.

In some embodiments, one of either the first actuator 900 or the second actuator 901 is equipped with the actuator module 930, while the other includes a spring or damper assembly. Since the teeth 910, 912 couple the first action attachment 911 and the second action attachment 913, both of the first handling blade 304 and the second handling blade 306 will move by the same distance even if both of the first actuator 900 and the second actuator 901 do not apply the same force. The teeth interlock ensures that both of the first handling blade 304 and the second handling blade 306 move simultaneously. The teeth interlock additionally provide a safeguard if one of the first actuator 900 or the second actuator 901 fail.

The actuator assembly of FIG. 9 links the movement of the first handling blade 304 and the second handling blade 306 so that they pivot about the first shaft 713 and the second shaft 710 respectively. The first actuator 900, the second actuator 901, the first section 906, and the second section 908 are all contained by the actuator housing 701 to reduce the dispersion of particles on a substrate during transfer. Additionally, the use of two pivot points disposed within the actuator housing 701 reduces the clearance height of the overall first and second substrate indexer assemblies 275a, 275b.

Figure 10:
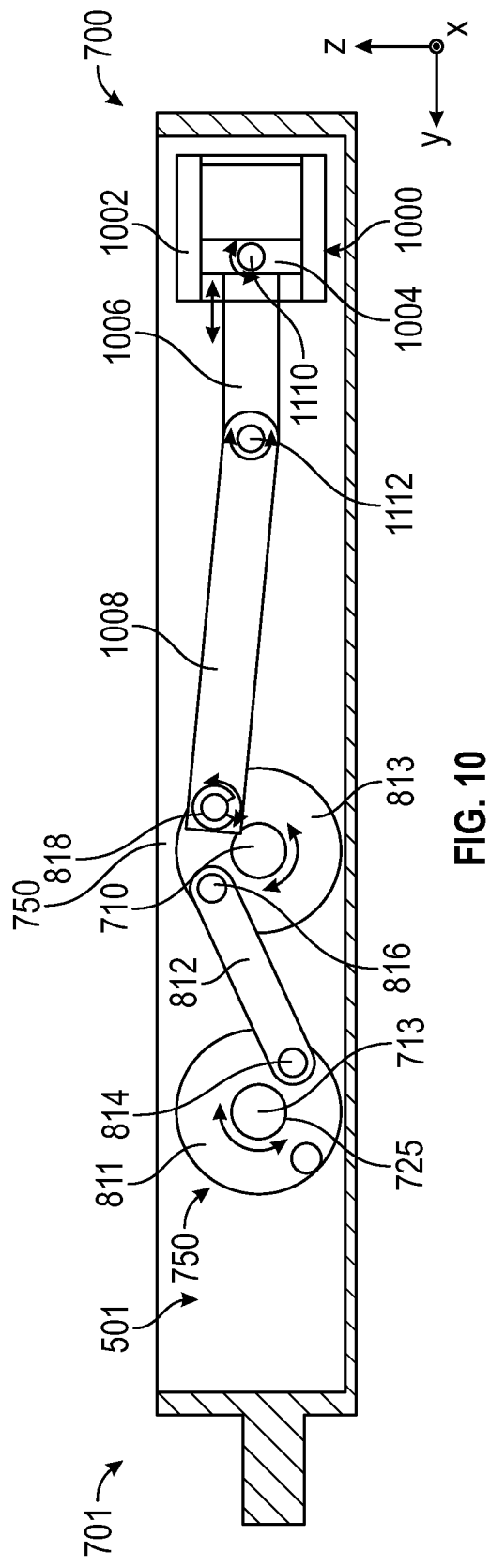
FIG. 10 is a schematic cross sectional side view of a portion of a substrate indexer assembly, according to another embodiment, which may be used with the substrate indexer assembly of FIG. 7A-7B.

FIG. 10 is a schematic cross sectional side view of an actuator assembly, according to another embodiment, which may be used with the substrate indexer assembly 275a, 275b of FIG. 7A-7B. The blade actuator assembly 700 is described and utilizes a linked assembly. The linked assembly is similar to the assembly of FIG. 8, but the actuator 800 of FIG. 8 is replaced with a compact actuator 1000. The compact actuator 1000 is shown in cross section and includes an actuator cylinder 1002, a piston 1004, a first force transfer arm 1006, and a second force transfer arm 1008. The piston 1004 is a pneumatic cylinder and is connected to gas lines (not shown). As the piston 1004 is moved within the actuator cylinder 1002, the first force transfer arm 1006 is moved along with the piston 1004 and imparts a force on the second force transfer arm 1008. The second force transfer arm 1008 then imparts a force on the second action attachment 813 via the third attachment point 818. The second action attachment 813 then rotates in either a clockwise or counterclockwise direction and the link 812 imparts motion upon the first action attachment 811.

The first force transfer arm 1006 is coupled to the piston 1004 at a coupling point 1110. The coupling point 1110 allows for rotation of the first force transfer arm 1006 about the coupling point 1110. The second force transfer arm 1008 is coupled to the first force transfer arm 1006 at a coupling point 1112. The coupling point 1112 allows for rotation of the second force transfer arm 1008 about the coupling point 1112, and provides greater flexibility as the third attachment point 818 rotates about the second shaft 710.

Figure 11:
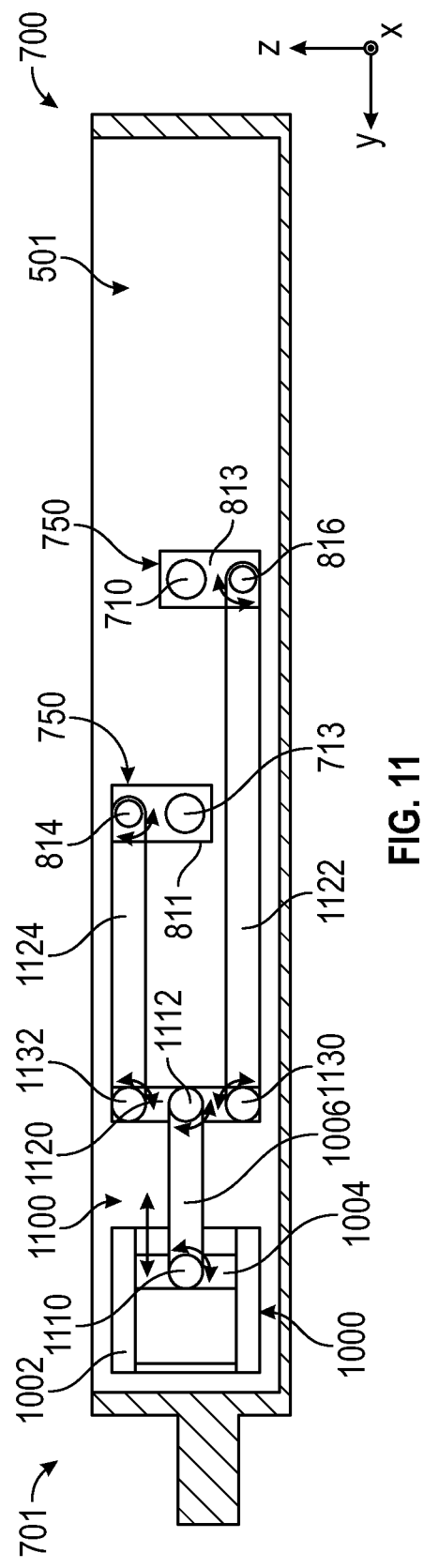
FIG. 11 is a schematic cross sectional side view of a portion of a substrate indexer assembly, according to another embodiment, which may be used with the substrate indexer assembly of FIG. 7A-7B.

FIG. 11 is a schematic cross sectional side view of an actuator assembly, according to another embodiment, which may be used with the substrate indexer assembly 275a, 275b of FIG. 7A-7B. The blade actuator assembly 700 is described and utilizes a pivot assembly 1100. The pivot assembly 1100 allows for both of the first action attachment 811 and the second action attachment 813 to be rotated simultaneously without being directly coupled to one another.

The pivot assembly 1100 includes the action attachments 750 and the compact actuator 1000. The first force transfer arm 1006 is coupled to a rotatable arm 1120 at the coupling point 1112 instead of the second force transfer arm 1008. The first force transfer arm 1006 exerts a force parallel to the length of the first force transfer arm 1006 on the rotatable arm 1120 when the compact actuator 1000 is extended and the piston 1004 is moved. The first force transfer arm 1006 is coupled to the rotatable arm 1120 at a coupling point 1112. The rotatable arm 1120 transfers the force to a first attachment member 1122 and a second attachment member 1124.

The first attachment member 1122 is coupled to the rotatable arm 1120 at a first rotation point 1130 and the second attachment member 1124 is coupled to the rotatable arm 1120 at a second rotation point 1132. The first rotation point 1130 and the second rotation point 1132 are on opposite distal ends of the rotatable arm 1120 and on opposite sides of the coupling point 1112. The first attachment member 1122 rotates the second action attachment 813 in a counterclockwise direction while the second attachment member 1124 rotates the first action attachment 811 in a clockwise direction and vice versa. Rotating the first action attachment 811 rotates the first shaft 713 in a similar direction and therefore moves the first handling blade 304. Rotating the second action attachment 813 rotates the second shaft 710 in a similar direction and therefore moves the second handling blade 306. The first attachment member 1122 is coupled to the second action attachment 813 at the second attachment point 816 and the second attachment member 1124 is coupled to the first action attachment 811 at the first attachment point 814.

FIG. 12 is a schematic cross sectional side view of an actuator assembly, according to another embodiment, which may be used with the substrate indexer assembly 275a, 275b of FIG. 7A-7B. The blade actuator assembly 700 is described and utilizes a rack and pinion assembly 1200. The rack and pinion assembly 1200 further includes the compact actuator 1000. The first force transfer arm 1006 of the compact actuator 1000 is coupled to a rack coupling portion 1202. The rack coupling portion 1202 includes a first rack 1204 and a second rack 1206 disposed on opposite distal ends of the rack coupling portion 1202. The first rack 1204 and the second rack 1206 are disposed on opposite sides of the coupling point 1112, wherein the coupling point 1112 connects the rack coupling portion 1202 to the force transfer arm 1006. The first rack 1204 and the second rack 1206 are parallel and include teeth, which mesh with teeth found on the first action attachment 811 and the second action attachment 813. The first action attachment 811 and the second action attachment 813 are partial cylinders and the teeth are disposed around the outer edge of the circular portion of the partial cylinders.

When the piston 1004 moves within the actuator cylinder, the force is transferred along the first force transfer arm 1006 and moves the rack coupling portion 1202 in a direction parallel to the motion of the piston 1004. The rack coupling portion 1202 moves the first rack 1204 and the second rack 1206. The first rack 1204 rotates the first action attachment 811 in either a clockwise or a counterclockwise direction depending upon the direction in which the first rack 1204 is moving. The second rack 1206 rotates the second action attachment 813 in a direction opposite the direction of rotation of the first rack 1206. The rotation of the first action attachment 811 and the second action attachment 813 rotates the first shaft 713 and the second shaft 710, which subsequently moves the first handling blade 304 and the second handling blade 306.

The embodiments disclosed herein reduce the height of the substrate handling system by reducing the height of each of the first substrate indexer assembly 275a and the second substrate indexer assembly 275b. The reduced height enables the substrate indexer assemblies 275a, 275b to be disposed below one or more horizontal pre-clean modules 125 or other modules, which are positioned at least partially above the substrate handling system 200. The substrate indexer assemblies 275a, 275b described herein also enclose the moving components, which enable movement of the first handling blade 304 and the second handling blade 306. By enclosing the moving components of the blade actuator assemblies, it has been found that there is a reduction in particle contamination on the surface of the substrates transported by the substrate handling system 200.

While the foregoing is directed to embodiments of the present disclosure, other and further embodiments of the disclosure may be devised without departing from the basic scope thereof, and the scope thereof is determined by the claims that follow.

What is claimed is:

1. A substrate handling system, comprising:
    an actuator housing comprising an outer wall having a first opening and a second opening formed therethrough;
    an actuator assembly comprising:
        a linear actuator enclosed within the actuator housing, the linear actuator comprising an actuator shaft; and
        a position sensor positioned to detect a position of the linear actuator;
    a first handling blade directly coupled to the actuator assembly through the first opening and disposed outside of the actuator housing, the first handling blade comprising a first support finger;
    a second handling blade directly coupled to the actuator assembly through the second opening and disposed outside of the actuator housing, the second handling blade comprising a second support finger;
    a first coupling member coupled to the first handling blade and a second coupling member coupled to the second handling blade; and
    two hitch components coupled to the linear actuator, wherein each of the two hitch components include a protrusion disposed within a slot within each of the first coupling member and the second coupling member.

2. The substrate handling system of claim 1, wherein the first handling blade and the second handling blade are disposed outward and in a similar direction from the actuator housing.

3. The substrate handling system of claim 2, wherein both of the first handling blade and the second handling blade further comprise an inner surface and an outer surface, wherein the first support finger is disposed on the inner surface of the first handling blade and the second support finger is disposed on the inner surface of the second handling blade.

4. The substrate handling system of claim 1, wherein the first coupling member and the second coupling member are disposed through each of the first opening and the second opening respectively.

5. The substrate handling system of claim 1, further comprising a guide rail assembly disposed within the actuator housing and coupled to the first handling blade and the second handling blade.

6. The substrate handling system of claim 1, wherein the actuator housing, the actuator assembly, the first handling blade, and the second handling blade form a first substrate indexer assembly and further comprising a second substrate indexer assembly, wherein the second substrate indexer assembly further comprises:
   an actuator housing comprising an outer wall with a first opening and a second opening formed therethrough;
   an actuator assembly comprising:
      a linear actuator enclosed within the actuator housing;
      a first handling blade directly coupled to the actuator assembly through the first opening and disposed outside of the actuator housing, the first handling blade comprising a first support finger; and
      a second handling blade directly coupled to the actuator assembly through the second opening and disposed outside of the actuator housing, the second handling blade comprising a second support finger.

7. The substrate handling system of claim 6, further comprising:
   a support column;
   a first rail disposed along a length of the support column, the first substrate indexer assembly moveably coupled to the first rail by a first connection shaft and a first actuator assembly, wherein the first connection shaft is rotatably connected to the first actuator assembly; and
   a second rail disposed along the length of the support column and parallel to the first rail, the second substrate indexer assembly moveably coupled to the second rail by a second connection shaft and a second actuator assembly, wherein the second connection shaft is rotatably connected to the second actuator assembly.

8. A substrate handling system comprising:
   a guiding beam;
   a support column coupled to the guiding beam and moveable along a first axis;
   a first rail disposed along a length of the support column and perpendicular to the first axis;
   a second rail disposed along the length of the support column and parallel to the first rail;
   a first substrate indexer assembly moveably coupled to the first rail;
   a second substrate indexer assembly moveably coupled to the second rail, wherein the first substrate indexer assembly and the second substrate indexer assembly each comprises:
      an actuator housing comprising an outer wall with a first opening and a second opening formed therethrough;
      an actuator assembly comprising:
         a linear actuator enclosed within the actuator housing, the linear actuator comprising an actuator shaft; and
         a position sensor positioned to detect a position of the linear actuator;
      a first handling blade directly coupled to the actuator assembly and disposed outside of the actuator housing, the first handling blade comprising a first support finger;
      a second handling blade directly coupled to the actuator assembly and disposed outside of the actuator housing, the second handling blade comprising a second support finger;
      a first coupling member coupled to the first handling blade and a second coupling member coupled to the second handling blade; and
      two hitch components coupled to the linear actuator, wherein each of the two hitch components include a protrusion disposed within a slot within each of the first coupling member and the second coupling member.

9. The substrate handling system of claim 8, wherein the first substrate indexer assembly is coupled to the first rail by a connection shaft.

10. The substrate handling system of claim 9, wherein the connection shaft is configured to rotate the actuator housing about an axis, such that the first handling blade and the second handling blade swing between a vertical and a horizontal position.

11. The substrate handling system of claim 8, further comprising a coupling member disposed between the actuator assembly and each of the first handling blade and the second handling blade.

12. The substrate handling system of claim 8, wherein the actuator assembly further comprises a guide rail assembly disposed within the actuator housing, the guide rail assembly coupled to the first handling blade and the second handling blade.

13. The substrate handling system of claim 12, further comprising:
   two brackets, each of the two brackets coupled to one of the first and second handling blades and one of the first coupling member or the second coupling member; and
   two opening covers, each of the opening covers disposed at least partially between the two brackets, the first coupling member, and the second coupling member.

14. A substrate handling system comprising:
   a guiding beam;
   a support column coupled to the guiding beam and moveable along a first axis;
   a first rail disposed along a length of the support column and perpendicular to the first axis;
   a second rail disposed along the length of the support column and parallel to the first rail;
   a first substrate indexer assembly moveably coupled to the first rail;
   a second substrate indexer assembly moveably coupled to the second rail; and
   a controller, the controller configured to:
      secure a substrate within a horizontal pre-clean module with the first substrate indexer assembly in a horizontal position;
      remove the substrate from the horizontal pre-clean module with the first substrate indexer assembly;
      swing the substrate to a vertical position after securing the substrate by pivoting the first substrate indexer assembly;
      lower the substrate into a vertical cleaning module;
      release the substrate after lowering the substrate into the vertical cleaning module;

after releasing the substrate, secure the substrate with the second substrate indexer assembly from the vertical cleaning module;

raise the substrate to a transfer position after securing the substrate with the second substrate indexer assembly; and move the support column in a horizontal direction along the guiding beam.

15. The substrate handling system of claim 14, wherein the first substrate indexer assembly and the second substrate indexer assembly each comprise:

an actuator housing comprising an outer wall with a first opening and a second opening formed therethrough;

an actuator assembly;

a first handling blade directly coupled to the actuator assembly and disposed outside of the actuator housing, the first handling blade comprising a first support finger; and a second handling blade directly coupled to the actuator assembly and disposed outside of the actuator housing, the second handling blade comprising a second support finger.

16. The substrate handling system of claim 14, wherein the vertical cleaning module is a spray box or a brush box.

\* \* \* \* \*